(12) United States Patent
Miyake

(10) Patent No.: US 8,948,900 B2
(45) Date of Patent: Feb. 3, 2015

(54) COMPONENT MOUNTING APPARATUS

(75) Inventor: Yasushi Miyake, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 448 days.

(21) Appl. No.: 13/357,407

(22) Filed: Jan. 24, 2012

(65) Prior Publication Data

US 2013/0025118 A1   Jan. 31, 2013

(30) Foreign Application Priority Data

Feb. 24, 2011   (JP) .................................. 2011-037991

(51) Int. Cl.
*G06F 19/00* (2011.01)
*H05K 13/08* (2006.01)
*H05K 13/04* (2006.01)

(52) U.S. Cl.
CPC ............ *H05K 13/08* (2013.01); *H05K 13/0404* (2013.01)
USPC ................ 700/121; 700/181; 29/740; 29/833

(58) Field of Classification Search
USPC .............................. 700/121, 181; 29/740, 833
See application file for complete search history.

(56) References Cited

U.S. PATENT DOCUMENTS

| 6,216,341 | B1 * | 4/2001 | Nakahara ........................ 29/833 |
| 2006/0004479 | A1 * | 1/2006 | Oyama et al. ................. 700/181 |
| 2009/0044401 | A1 * | 2/2009 | Maenishi ........................ 29/740 |
| 2009/0049680 | A1 * | 2/2009 | Morita ............................ 29/740 |

FOREIGN PATENT DOCUMENTS

| DE | 10 2005 028 943 A1 | 2/2006 |
| EP | 0 576 678 A1 | 1/1994 |
| JP | 2009-094283 A | 4/2009 |

OTHER PUBLICATIONS

The Extended European Search Report dated Jul. 3, 2012; EP Application No. 12001214.1-1232.

* cited by examiner

*Primary Examiner* — Mohammad Ali
*Assistant Examiner* — Anthony Whittington
(74) *Attorney, Agent, or Firm* — Studebaker & Brackett PC

(57) ABSTRACT

A component mounting apparatus includes: an operational sequence supervision unit which is created in compiler language determining an operational sequence specifying a series of sequence operations of suctioning, recognizing and mounting a component; and a second memory unit which stores a custom program, created in interpreter language and specifying an operation different from the series of sequence operations, and custom program designation information that designates execution of the custom program. The operational sequence supervision unit controls a switching process for switching from the series of sequence operations to an interpreter language processing execution routine for executing the custom program, during, or before or after, the series of sequence operations in accordance with the custom program designation information.

6 Claims, 21 Drawing Sheets

FIG. 5

SETTING PARAMETERS

SEQUENCE DATA

| NO | SEQUENCE | SUCTION NUMBER | ... |
|---|---|---|---|
| 1 | STANDARD | ① | ... |
| 2 | STANDARD | ② | ... |
| 3 | CHECKACCURACY | – | ... |
| 4 | STANDARD | ③ | ... |
| ... | ... | ... | ... |

MOUNTING DATA

| NO | MOUNTING COORDINATE X | MOUNTING COORDINATE Y | MOUNTING COORDINATE R | COMPONENT MOUNTING NUMBER | ... |
|---|---|---|---|---|---|
| ① | 100.000 | 100.000 | 0.000 | ① | ... |
| ② | 200.000 | 100.000 | 90.000 | ② | ... |
| ③ | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SUCTION AND MOUNTING ACTION | ... |
|---|---|---|---|---|---|
| ① | 10.000 | 0.000 | 0.000 | HIGH-SPEED | ... |
| ② | 20.000 | 0.000 | 90.000 | LOW-SPEED | ... |
| ③ | 30.000 | 0.000 | 0.000 | HIGH-SPEED | ... |
| ... | ... | ... | ... | ... | ... |

FIG. 6

CUSTOM PROGRAM

```
CheckAccuracy;
MoveXY 200.000 100.000
Result = RecognizeA
If(Result>0) Then Stop
End
```

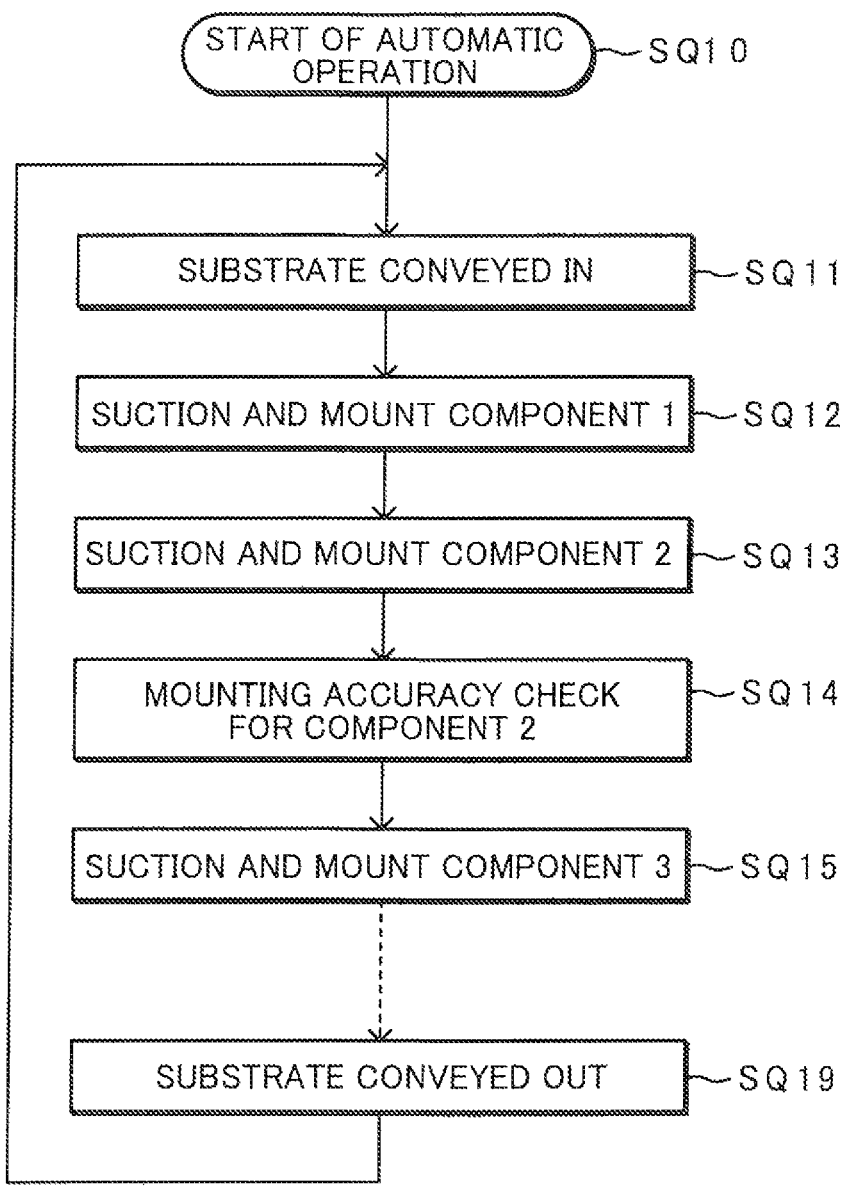

FIG. 9

SETTING PARAMETERS

MOUNTING COORDINATES & MOUNTING ORDER DATA

| NO | MOUNTING COORDINATE X | MOUNTING COORDINATE Y | MOUNTING COORDINATE R | COMPONENT MOUNTING NUMBER | ... |
|---|---|---|---|---|---|
| 1 | 100.000 | 100.000 | 0.000 | ① | ... |
| 2 | 200.000 | 100.000 | 90.000 | ② | ... |
| 3 | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SEQUENCE | SUCTION AND MOUNTING ACTION | ... |
|---|---|---|---|---|---|---|
| ① | 10.000 | 0.000 | 0.000 | STANDARD | HIGH-SPEED | ... |
| ② | 20.000 | 0.000 | 90.000 | ① | – | ... |
| ③ | 30.000 | 0.000 | 0.000 | STANDARD | HIGH-SPEED | ... |
| ... | ... | ... | ... | ... | ... | ... |

SEQUENCE DATA

| NO | SUCTION SEQUENCE | RECOGNITION SEQUENCE | MOUNTING SEQUENCE |
|---|---|---|---|
| ① | AdaptPolarity | STANDARD | STANDARD |
| ... | ... | ... | ... |

FIG. 10

CUSTOM PROGRAM

```
AdaptPolarity;
MoveXY 20.000 0.000
Result = RecognizeB
If(Result>0)
MoveR 180.000
EndIf
MoveZ 0.000
Time 0.1
MoveZ 20.000
End
```

FIG. 13

SETTING PARAMETERS

MOUNTING COORDINATES & MOUNTING ORDER DATA

| NO | MOUNTING COORDINATE X | MOUNTING COORDINATE Y | MOUNTING COORDINATE R | COMPONENT MOUNTING NUMBER | ... |
|---|---|---|---|---|---|
| 1 | 100.000 | 100.000 | 0.000 | ① | ... |
| 2 | 200.000 | 100.000 | 90.000 | ② | ... |
| 3 | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SEQUENCE | SUCTION AND MOUNTING ACTION | ... |
|---|---|---|---|---|---|---|
| ① | 10.000 | 0.000 | 0.000 | STANDARD | HIGH-SPEED | ... |
| ② | 20.000 | 0.000 | 90.000 | ① | - | ... |
| ③ | 30.000 | 0.000 | 0.000 | STANDARD | HIGH-SPEED | ... |
| ... | ... | ... | ... | ... | ... | ... |

SEQUENCE DATA

| NO | BEFORE SUCTION SEQUENCE | BEFORE RECOGNITION SEQUENCE | BEFORE MOUNTING SEQUENCE | AFTER MOUNTING SEQUENCE |
|---|---|---|---|---|
| ① | - | DipAction | - | - |
| ... | ... | ... | ... | ... |

FIG. 14

CUSTOM PROGRAM

```
DipAction:
MoveXY 50.000 50.000
Ready = DI(a)
While(Ready = 0)
Wend
DO(a) = 0
MoveZ 0.000
Timer 0.1
MoveZ 20.000
DO(a) = 1
End
```

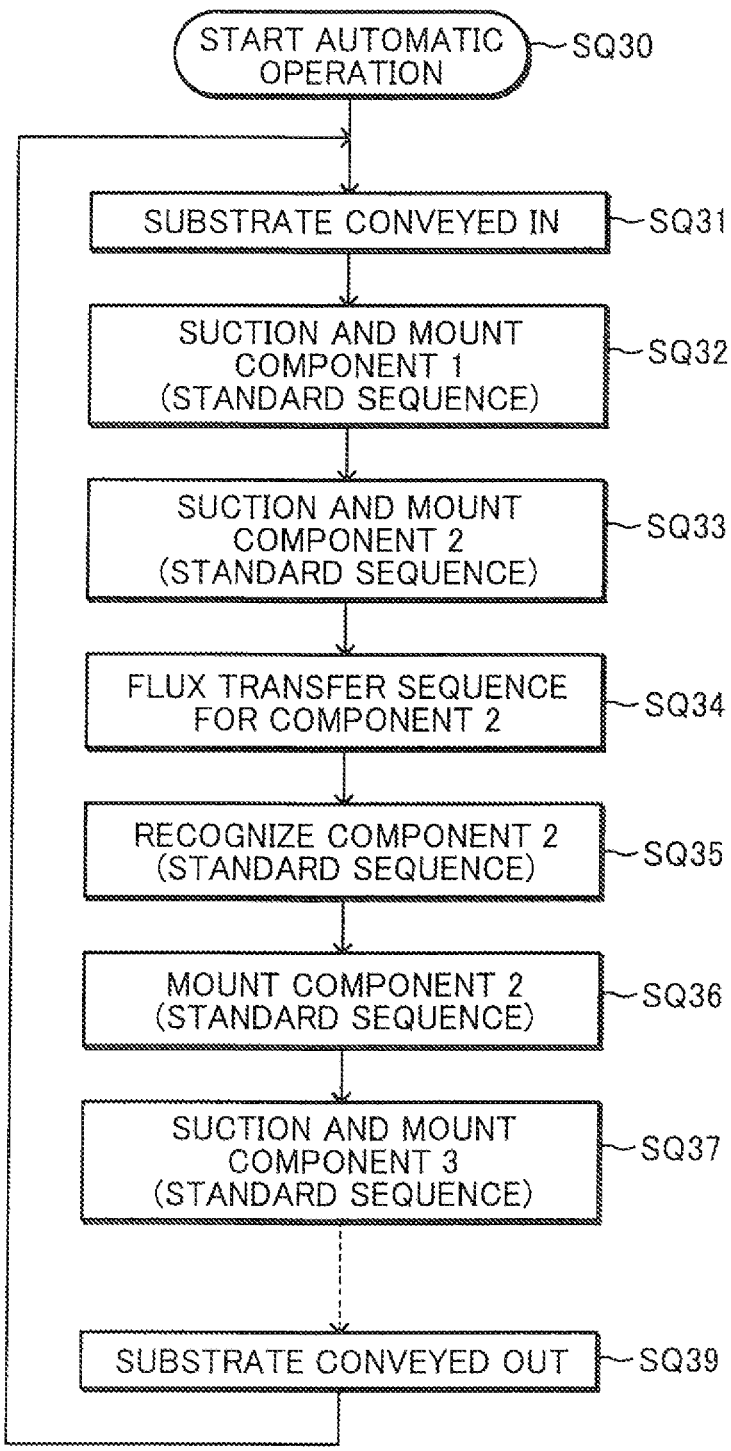

FIG. 17

SETTING PARAMETERS

MOUNTING COORDINATES & MOUNTING ORDER DATA

| NO | MOUNTING COORDINATE X | MOUNTING COORDINATE Y | MOUNTING COORDINATE R | COMPONENT MOUNTING NUMBER | ... |
|---|---|---|---|---|---|
| 1 | 100.000 | 100.000 | 0.000 | ① | ... |
| 2 | 200.000 | 100.000 | 90.000 | ② | ... |
| 3 | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SUCTION AND MOUNTING ACTION | ... |
|---|---|---|---|---|---|
| ① | 10.000 | 0.000 | 0.000 | HIGH-SPEED | ... |
| ② | 20.000 | 0.000 | 90.000 | LOW-SPEED | ... |
| ③ | 30.000 | 0.000 | 0.000 | HIGH-SPEED | ... |
| ... | ... | ... | ... | ... | ... |

SEQUENCE DURING SUBSTRATE CONVEYANCE

CleanNozzle

FIG. 18

CUSTOM PROGRAM

```
CleanNozzle;
MoveXY 50.000 50.000
Ready = DI(b)
While(Ready = 0)
Wend
MoveZ 0.000
DO(b) = 1
Timer 0.1
DO(b) = 0
MoveZ 20.000
End
```

FIG. 21

SETTING PARAMETERS

MOUNTING COORDINATES & MOUNTING ORDER DATA

| NO | MOUNTING COORDINATE X | MOUNTING COORDINATE Y | MOUNTING COORDINATE R | COMPONENT NUMBER | ... |
|---|---|---|---|---|---|
| 1 | 100.000 | 100.000 | 0.000 | ① | ... |
| 2 | 200.000 | 100.000 | 90.000 | ② | ... |
| 3 | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SUCTION AND MOUNTING ACTION | ... |
|---|---|---|---|---|---|
| ① | 10.000 | 0.000 | 0.000 | HIGH-SPEED | ... |
| ② | 20.000 | 0.000 | 90.000 | LOW-SPEED | ... |
| ③ | 30.000 | 0.000 | 0.000 | HIGH-SPEED | ... |
| ... | ... | ... | ... | ... | ... |

PERIODIC EXECUTION SEQUENCE

| INTERVAL (MIN.) | SEQUENCE |
|---|---|
| 10 | CleanNozzle |

PRIOR ART
FIG. 24

SETTING PARAMETERS

MOUNTING COORDINATES & MOUNTING ORDER DATA

| NO | MOUNTING COORDINATE X | MOUNTING COORDINATE Y | MOUNTING COORDINATE R | COMPONENT NUMBER | ... |
|---|---|---|---|---|---|
| 1 | 100.000 | 100.000 | 0.000 | ① | ... |
| 2 | 200.000 | 100.000 | 90.000 | ② | ... |
| 3 | 300.000 | 100.000 | 0.000 | ③ | ... |
| ... | ... | ... | ... | ... | ... |

COMPONENT DATA

| NO | SUCTION COORDINATE X | SUCTION COORDINATE Y | SUCTION COORDINATE R | SUCTION AND MOUNTING ACTION | ... |
|---|---|---|---|---|---|
| ① | 10.000 | 0.000 | 0.000 | HIGH-SPEED | ... |
| ② | 20.000 | 0.000 | 90.000 | LOW-SPEED | ... |
| ③ | 30.000 | 0.000 | 0.000 | HIGH-SPEED | ... |
| ... | ... | ... | ... | ... | ... |

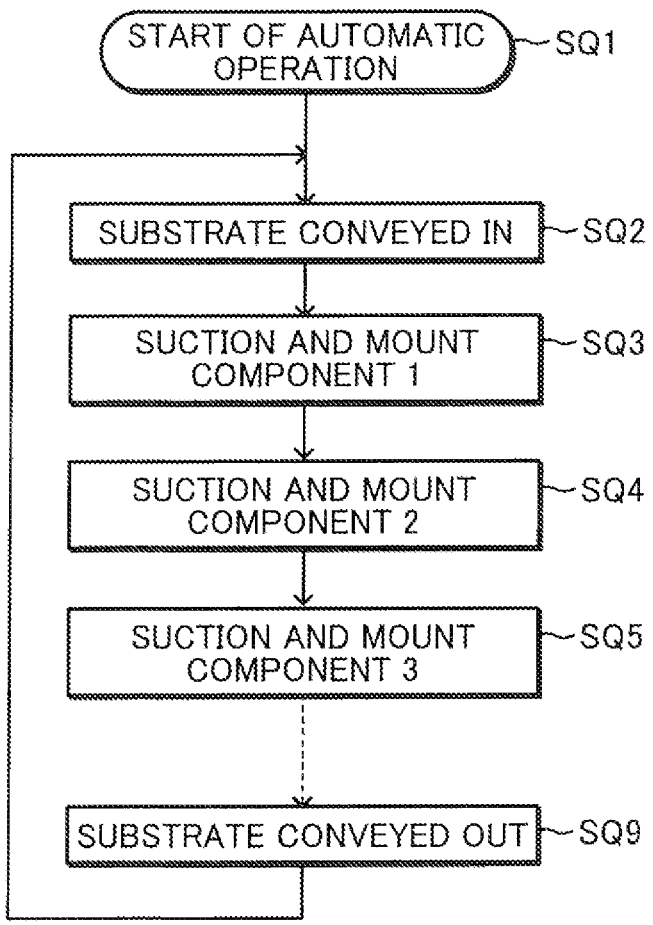

COMPONENT MOUNTING APPARATUS

BACKGROUND OF THE INVENTION

1. Field of the Invention

The present invention relates to a component mounting apparatus which suctions and recognizes a component, mounts the component on a board conveyed to the apparatus, and then conveys the board out from the apparatus.

2. Description of the Related Art

A component mounting apparatus which includes operational sequence specification means for designating a series of operational sequences consisting of suctioning, recognizing and mounting a component, a memory unit for storing component data relating to components to be suctioned and mounted, and mounting data indicating the coordinates on a board where components are to be mounted, and the like, and a mounting unit which mounts components on a board conveyed into the apparatus, using the component data and the mounting data, and conveys the board out from the apparatus, is commonly known in the prior art, as described in Japanese Patent Application Laid-open No. 2009-94283, for example.

A conventional component mounting apparatus has operational sequence specification means for executing the processing in steps S1 to S7, as shown in the flowchart in FIG. 23. As shown by the setting parameters in FIG. 24, the memory unit of this component mounting apparatus stores numbers specifying a sequence for suctioning and mounting components, suction coordinates X,Y indicating a position of a component which has been supplied, a suction angle R for the component, a supply and mounting action specifying a suctioning operation for the component (high-speed, low-speed, etc.), mounting coordinates X,Y which indicate a mounting position of the component on a board, a mounting angle R for the component, and the like.

The component mounting apparatus described above starts automatic operation at step S1 of the operational sequence, and thereafter repeatedly executes the processing in steps S2 to S7. In step S2, a board is conveyed into the apparatus on a conveyor. In step S3, a component which is to be mounted on a board is selected from amongst supplied components and is suctioned, by referring to the setting parameters. In step S4, the suctioned component is subjected to image processing and is recognized. In step S5, the recognized component is mounted on the board which has been conveyed into the apparatus, by referring to the setting parameters. In step S6, it is judged whether all of the components have been mounted on the board, and the cycle of processing in steps S3 to S6 is executed until all of the components have been mounted on the board in accordance with the setting parameters. When all of the components have been mounted on the board, a "Yes" verdict is returned at step S6, and in step S7, the board on which all of the components have been mounted is conveyed out from the apparatus.

After outward conveyance of the board, the processing in steps S2 to S7 above is executed again and the next board is conveyed into the apparatus, components are mounted again on this board, and the board is then conveyed out from the apparatus. By this means, as shown in the sequence operation diagram in FIG. 25, after the start of automatic operation (SQ1), the operations of inward conveyance of board (SQ2), supply and mounting of components 1, 2, 3, . . . (SQ3, SQ4, SQ5 . . . ), and outward conveyance of board (SQ9) are carried out repeatedly.

In a component mounting apparatus of this type, essentially, it is necessary to prepare operational sequence specification means respectively so as to correspond to each one of many varied surface mounting manufacturing processes. In this case, the operational sequence specification means is often created in compiler language in order to shorten the processing time and raise the production capacity of the equipment, and is generally created in advanced compiler language in order to execute complicated processing by utilizing the functions of the basic software (known as the operating system) or hardware.

In order to change the operational sequence processing with the object of achieving a user-specific manufacturing process, a user needs to understand the system software running on the equipment and the hardware interface specifications, and the like, and it is also a prerequisite for the user to learn programming techniques in advanced language which is suited to the particular equipment, and to acquire a software development environment suited to that language. Therefore, it is extremely complicated for a user to change the operational sequence processing. On the other hand, if the operational sequence is created using an interpreter type language, then the operational sequence can be changed relatively easily. However, if an interpreter type language is used to program an operational sequence of a high-specification component mounting apparatus, then several thousands of lines to several tens of thousands of lines of program are required and therefore the programming and debugging work require a very large amount of time. Furthermore, from the viewpoint of execution speed, the speed is inferior compared to processing achieved by compiler type language.

SUMMARY OF THE INVENTION

The object of the present invention is to provide a component mounting apparatus which can respond accurately to many varied surface mounting manufacturing processes and which can execute component mounting in a short period of time.

The component mounting apparatus relating to one aspect of the present invention which achieves this object is a component mounting apparatus including:

an operational sequence supervision unit which is created in compiler language determining an operational sequence specifying a series of sequence operations of suctioning, recognizing and mounting a component;

a first memory unit which stores component data relating to a component to be suctioned and mounted, and mounting data designating coordinates on a board where a component is to be mounted;

a second memory unit which stores a custom program, written in interpreter language and specifying an operation different from the series of sequence operations, and custom program designation information that designates execution of the custom program; and a mounting unit which mounts a component on a board that has been conveyed into the apparatus and then conveys the board out from the apparatus by using component data and mounting data stored in the first memory unit, by executing an operational sequence determined by the operational sequence supervision unit, wherein the operational sequence supervision unit controls a switching process for switching from the series of sequence operations to an interpreter language processing execution routine for executing the custom program, during, or before or after, the series of sequence operations in accordance with the custom program designation information.

The mounting unit executes an operation specified by the custom program in accordance with the custom program designation information, during, or before or after, sequence operations of suctioning, recognizing and mounting a component as determined by the operational sequence supervision unit.

BRIEF DESCRIPTION OF THE DRAWINGS

FIG. 5 is a data format diagram showing one example of setting parameters stored in a component mounting apparatus relating to the first embodiment;

FIG. 6 is a diagram showing one example of a custom program stored in a component mounting apparatus relating to the first embodiment;

FIG. 7 is a sequence operation diagram of a component mounting apparatus relating to the first embodiment;

FIG. 9 is a data format diagram showing one example of setting parameters stored in a component mounting apparatus relating to the second embodiment;

FIG. 10 is a diagram showing one example of a custom program stored in a component mounting apparatus relating to the second embodiment;

FIG. 13 is a data format diagram showing one example of setting parameters stored in a component mounting apparatus relating to the third embodiment;

FIG. 14 is a diagram showing one example of a custom program stored in a component mounting apparatus relating to the third embodiment;

FIG. 15 is a sequence operation diagram of a component mounting apparatus relating to the third embodiment;

FIG. 17 is a data format diagram showing one example of setting parameters stored in a component mounting apparatus relating to the fourth embodiment;

FIG. 18 is a diagram showing one example of a custom program stored in a component mounting apparatus relating to the fourth and fifth embodiments;

FIG. 21 is a data format diagram showing one example of setting parameters stored in a component mounting apparatus relating to the fifth embodiment;

FIG. 24 is a data format diagram of setting parameters which are stored in a conventional component mounting apparatus; and FIG. 25 is a sequence operation diagram of a conventional component mounting apparatus.

DESCRIPTION OF THE PREFERRED EMBODIMENTS

Below, several embodiments of the present invention are described with reference to the drawings.

[Composition of the Component Mounting Apparatus]

Firstly, an example of the composition of a component mounting apparatus 1 which is common to the first to fifth embodiments described below will be explained. The component mounting apparatus 1 mounts electronic components on a circuit board CB which has been conveyed into the apparatus. In an actual production line for a circuit board CB, the component mounting apparatus 1 is coupled mutually in series with and used in conjunction with, for instance, a solder printing machine which carries out screen printing of solder paste onto the surface of the circuit board CB, other component mounting apparatuses, and a reflow machine which electrically connects electrodes of the electronic components with the circuit board CB by melting the solder paste at high temperature.

Figure 1:
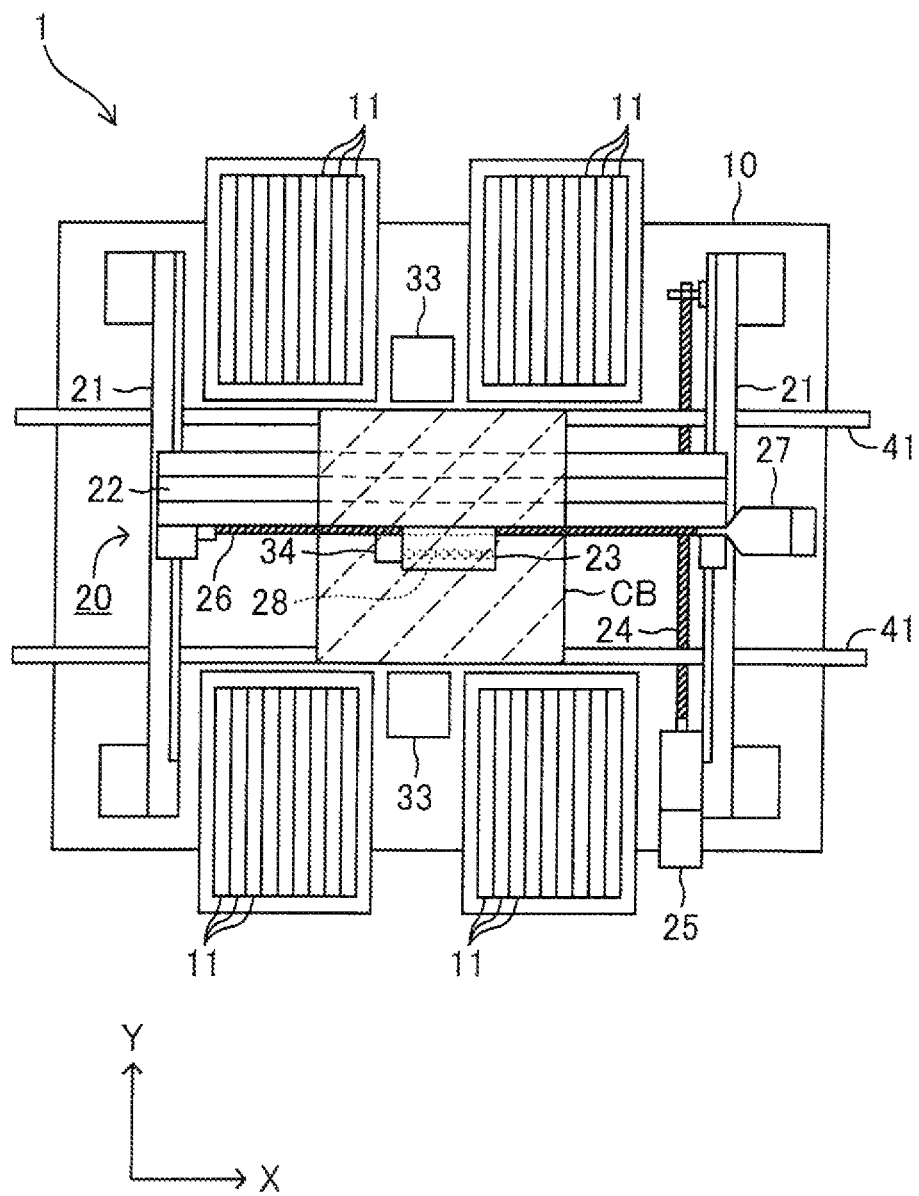
FIG. 1 is a general plan diagram of a component mounting apparatus which is common to each of the embodiments of the present invention.

As shown in FIG. 1, this component mounting apparatus 1 includes a conveyor 41 constituted by a pair of conveyance belts which are arranged in the center of a base 10 having a flatly formed upper surface. The conveyor 41 is driven to circulate in the X axis direction (the left/right direction in FIG. 1), and a circuit board CB is conveyed in the X axis direction due to friction with the upper surface of the conveyor 41. The conveyor 41 has respective end sections which project in the X axis direction from the base 10, and is connected in level fashion to other conveyors for the solder printing machine, other component mounting apparatuses and the reflow machine. The circuit board CB which is conveyed onto the base 10 of the component mounting apparatus by the conveyor 41 is halted by a board stopper 12 (see FIG. 2) which is not illustrated in FIG. 1, in a working position in the center of the base 10 (a region indicated by the single-dotted diagonal lines in FIG. 1).

A plurality of feeders 11 which supply electronic components, such as ICs, are arranged in laterally aligned fashion at four positions about the periphery of the work position. A component mounting apparatus 20 (mounting unit) is provided in the central portion of the base 10. The component mounting apparatus 20 is an apparatus which mounts electronic components on a circuit board CB which has been halted at the working position, and includes a pair of supporting legs 21, a head supporting body 22 and a head unit 23. The pair of supporting legs 21 are positioned on the base 10 on either side of the work position in the X axis direction, and respectively extend in the Y axis direction (the up/down direction in FIG. 1). The head supporting body 22 extends in the X axis direction and engages movably in the Y axis direction with the upper surfaces of the pair of supporting legs 21, at either end thereof. A Y axis ball screw 24 which extends in the Y axis direction is supported rotatably about an axis, on the supporting leg 21 on the right-hand side in FIG. 1. A ball nut (not illustrated) which is fixed to the head supporting body 22 is threadedly engaged with the Y axis ball screw 24. One end of the Y axis ball screw 24 is connected to the output shaft of a Y axis motor 25. By rotating the Y axis motor 25, the Y axis ball screw 24 turns about its axis, and the head supporting body 22 is moved in the Y axis direction.

The head unit 23 is supported movably in the X axis direction on the head supporting body 22. An X axis ball screw 26 which extends in the X axis direction is supported rotatably about an axis, on the head supporting body 22. A ball nut (not illustrated) which is fixed to the head supporting body 23 is threadedly engaged with the X axis ball screw 26. One end of the X axis ball screw 26 is connected to the output shaft of an X axis motor 27. By rotating the X axis motor 27, the X axis ball screw 26 turns about its axis, and the head unit 23 is moved in the X axis direction.

One or a plurality of mounting heads 28 which carry out mounting operations are installed on the head unit 23. The mounting heads 28 each project downwards from the lower surface of the head unit 23 and have a suction nozzle provided on the front end thereof. Each mounting head 28 can perform a rotating operation about an axis by driving the R axis motor 31 (see FIG. 2; not shown in FIG. 1), and can be raised or lowered with respect to the head unit 23 by driving the Z axis motor 32 (see FIG. 2; not shown in FIG. 1). Furthermore, negative pressure is supplied to the suction nozzles from a negative pressure generator 28a (not shown) (see FIG. 2). By means of this supply of negative pressure, a suction force is generated at the front end of the mounting head 28.

The component mounting apparatus 1 includes a pair of component recognition cameras 33 and a board recognition camera 34. The pair of component recognition cameras 33 are respectively provided on either side of the pair of conveyors 41, in the central portion of the base 10. The component recognition camera 33 is arranged with the imaging surface facing upwards, and is used to capture images of the lower surface of an electronic component which has been taken out from a feeder 11 by a mounting head 28. The board recognition camera 34 is fixed with the imaging surface facing downwards on the side of the head unit 23, and is used to capture images of a circuit board CB which has been halted at the work position.

Next, the electrical composition of the component mounting apparatus 1 is described with reference to FIG. 2. Overall control of the component mounting apparatus 1 is performed by the controller 50. The controller 50 is provided with: a calculation processing unit 51, an operational sequence supervision unit 52, a setting parameter memory unit 53 (first memory unit), a custom program memory unit 54 (second memory unit), a motor control unit 55, an external input/output unit 56, an image processing unit 57, a feeder control unit 58 and a communications unit 59.

The calculation processing unit 51 is constituted by a CPU (Central Processing Unit), or the like, and executes various processes which are described below. The operational sequence supervision unit 52 specifies an operational sequence which is described below. The setting parameter memory unit 53 stores setting parameters relating to suctioning and mounting which are described below. The custom program memory unit 54 stores a custom program which is described below. The motor control unit 55 is controlled by the calculation processing unit 51 and controls the rotation of the X axis motor 27, the Y axis motor 25, the Z axis motor 32 and the R axis motor 31. The external input/output unit 56 is controlled by the calculation processing unit 51 and controls driving of the negative pressure generator 28a, as well as controlling driving of the board stopper 12 and detection signals from the board sensor 13 are input to the external input/output unit 56. The board stopper 12 halts the circuit board CB which is conveyed by the conveyor 41. The board sensor 13 detects whether or not a circuit board CB which has been conveyed in by the conveyor 41 is situated at the prescribed detection position (work position). The image processing unit 57 is controlled by the calculation processing unit 51 and respectively reads in and processes the capture images from the component recognition camera 33 and the board recognition camera 34. The feeder control unit 58 is controlled by the calculation processing unit 51 and controls the supply of electronic components by the feeder 11.

The communications unit 59 carries out communications with respect to an apparatus other than the component mounting apparatus 1, and, for example, communicates with the conveyance apparatus 40 via a management computer (not illustrated) under the control of the calculation processing unit 51, and controls the conveyance of electronic components into and out from the apparatus by the conveyance apparatus 40. In this case, the inward and outward conveyance of electronic components also affects the processing by apparatuses other than the component mounting apparatus. Furthermore, a display unit 60 which is connected to the calculation processing unit 51 is also provided in the component mounting apparatus. The display unit 60 displays various images on the basis of display control implemented by the calculation processing unit 51.

First Embodiment

Next, a first embodiment of the present invention will be described. The composition of the component mounting apparatus 1 relating to this first embodiment is the same as the compositional example in FIGS. 1 and 2 described above. In the first embodiment, the component mounting apparatus 1 has an operational sequence supervision unit 52 which achieves the operational sequence in FIG. 3, including the "special interpreter language processing execution routine" in FIG. 4. The operational sequence supervision unit 52 is created in compiler language, and essentially controls a sequence for causing the component mounting apparatus 1 to repeatedly carry out standard sequence operations consisting of suctioning, recognizing and mounting electronic components. The operational sequence supervision unit 52 also specifies the execution of a "special interpreter language processing execution routine" during the repeated execution of the standard sequence operations. The "special interpreter language processing execution routine" is a routine for causing the component mounting apparatus to execute a custom program, which is described below.

The setting parameters shown in FIG. 5 are stored in the setting parameter memory unit 53, and the custom program shown in FIG. 6 is stored in the custom program memory unit 54. The setting parameters consist of sequence data, mounting data and component data. The sequence data indicates, in the order of the sequence operations which are executed in successive fashion, whether a sequence operation is a standard sequence operation, or a specially prepared sequence operation (custom operation). Furthermore, in the case of a standard sequence operation, the setting parameter memory unit 53 stores a mounting number which indicates a mounting order for an electronic component on a circuit board CB. In order to identify a custom operation, a custom program name is stored for the sequence operation. In this case, the custom program name is, for instance, "CheckAccuracy" (a mounting accuracy checking program). The mounting data is associated with the mounting number, and consists of mounting coordinates X,Y which represent a mounting position of an electronic component on the circuit board CB, a mounting coordinate R which represents a mounting angle of the electronic component on the circuit CB, and a component number which represents the electronic component. The component data is associated respectively with the component number and includes suction coordinates X,Y which represent a suction position of an electronic component on a feeder 11, a suction coordinate R which represents a suction angle of the electronic component on the mounting head 28, and a suctioning and mounting action which represents a suctioning and mounting speed of an electronic component by the mounting head 28 (negative pressure generator 28a).

The custom program is created in interpreter language and is a program which causes the component mounting apparatus to execute a special sequence operation other than the standard sequence operations of suctioning, recognizing and mounting an electronic component. The custom program "CheckAccuracy" (a mounting accuracy checking program) which is shown in FIG. 6 is one example, and this custom program "CheckAccuracy" is a program for executing process which judges whether the electronic component is mounted accurately on the circuit board CB. More specifically, this judgment process involves capturing images of a mounting coordinates position of an electronic component on a circuit board CB, with the board recognition camera 34, and processing the captured image to judge whether or not the electronic component has been accurately mounted at the correct position on the circuit board CB. If the judgment result is not "accurate", then the sequence operations for mounting an electronic component are halted.

Next, the operation of a component mounting apparatus 1 relating to a first embodiment will be described. When the start of execution of a component mounting program is instructed, the calculation processing unit 51 starts automatic operation of the component mounting apparatus 1 at step S10 in FIG. 3, and board inward conveyance processing which conveys the circuit board CB into the apparatus is executed at step S11.

Figure 2:
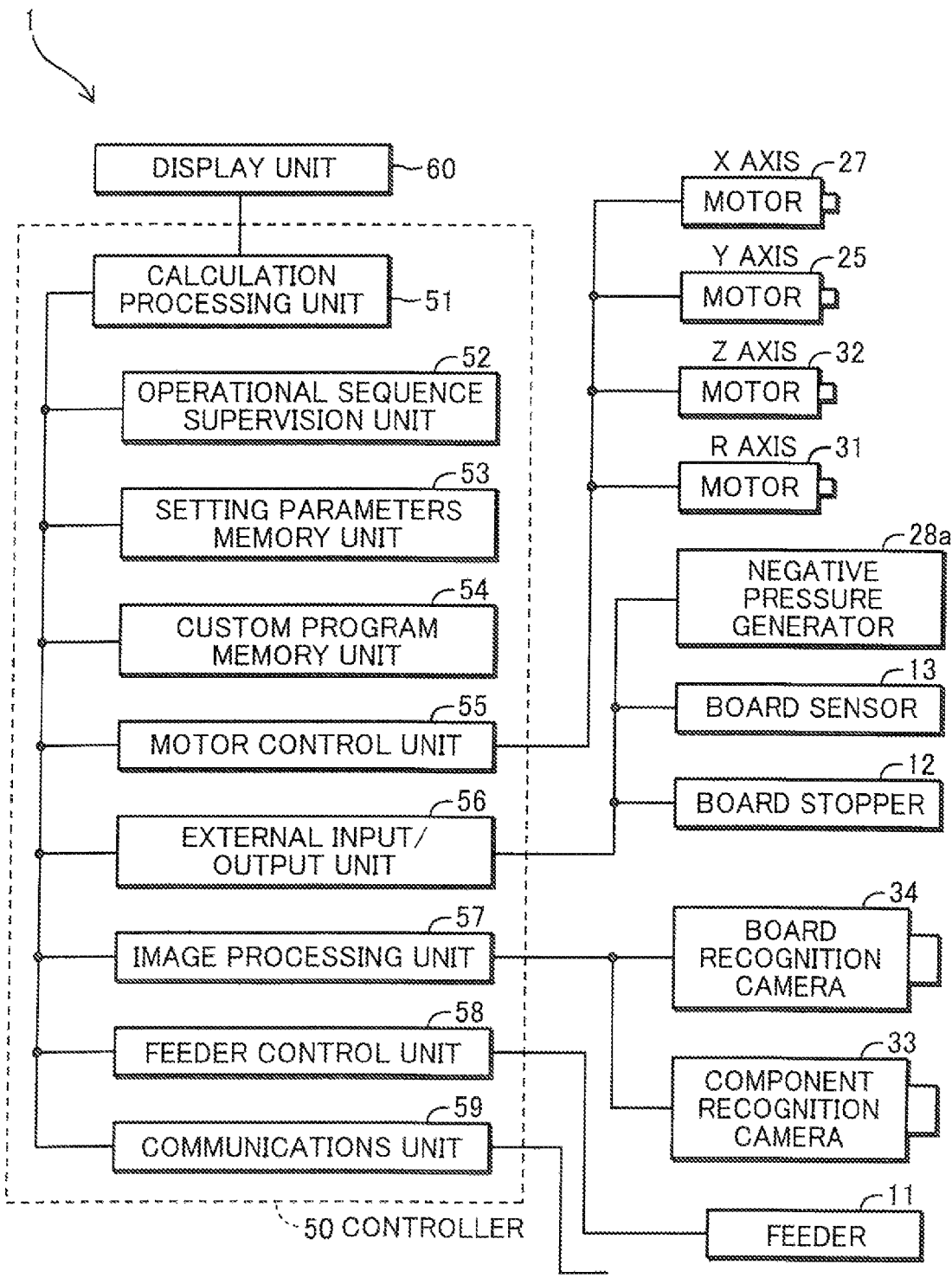
FIG. 2 is a block diagram showing an electrical composition of the component mounting apparatus in FIG. 1.

In a circuit board CB inward conveyance process, in the component mounting apparatus 1 shown in FIGS. 1 and 2, the calculation processing unit 51 receives a detection signal from the board sensor 13 via the external input/output unit 56, confirms the inward conveyance of a circuit board CB to a prescribed position by the conveyor 41, and controls driving of the board stopper 12 to halt the circuit board CB at the prescribed position.

Moreover, in the inward conveyance process for a circuit board CB, the calculation processing unit 51 instructs the image processing unit 57 to acquire image information relating to the state of the circuit board CB which has been halted. The image processing unit 57 activates the board recognizing camera 34 fixed to the head unit 23 to capture an image of the halted circuit board CB, processes the captured image, and supplies information representing the state of the circuit board CB to the calculation processing unit 51.

Thereupon, at step S12, the operational sequence supervision unit 52 refers to the sequence data in the setting parameters shown in FIG. 5 and judges whether to execute a standard sequence operation or whether to execute a custom operation (custom program). The sequence data is data which successively specifies a standard sequence consisting of the suctioning, recognizing and mounting of electronic components, and a custom operation which is designated by a custom program, and in the present embodiment, the data is initially set to a standard sequence. Consequently, the operational sequence supervision unit 52 judges "standard" at step S12, and then proceeds to a component suctioning process in step S13.

In the component suctioning process in step S13, the calculation processing unit 51 refers to the component data in the setting parameters in FIG. 5, and acquires data relating to the suction coordinates X, Y, R and the suctioning and mounting action of the component number to be mounted on the circuit board CB by the first standard sequence operation. The calculation processing unit 51 controls driving of the Y axis motor 25 and X axis motor 27 via the motor control unit 55, thereby causing the mounting head 28 of the head unit 23 to move to a position indicated by the suction coordinates X,Y. After this movement of the mounting head 28, the calculation processing unit 51 controls driving of the R axis motor 31 in accordance with the acquired suction coordinate R via the motor control unit 55, so as to rotate the mounting head 28 by the angle indicated by the suction coordinate R. If the suction coordinate R is "0", the mounting head 28 is not rotated.

Thereupon, the calculation processing unit 51 lowers the mounting head 28 by controlling driving of the Z axis motor 32 via the motor control unit 55 and the external input/output unit 56, and also controls the negative pressure generator 28a of the suction nozzle in accordance with the acquired suctioning and mounting action so as to suction the electronic component at the speed indicated by the suctioning and mounting action. The calculation processing unit 51 raises the mounting head 28 by controlling driving of the Z axis motor 32 via the motor control unit 55, and then terminates the suctioning process.

The calculation processing unit 51 executes a processing command (not illustrated), and situates an electronic component which is to be suctioned on the feeder 11 at the correct position, at all times, by coordinated operation with the feeder control unit 58. In other words, the electronic component is always situated in the position indicated by the suction coordinates X,Y in the component data, and therefore the electronic component is suctioned accurately by the mounting head 28 provided on the head unit 23, by means of the suctioning process described above.

After the suctioning process in step S13 above, the calculation processing unit 51 executes a component recognition process in step S14. In this component recognition process, the calculation processing unit 51 firstly controls driving of the Y axis motor 25 and the X axis motor 27 via the motor control unit 55, thereby causing the mounting head 28 of the head unit 23 to move above the component recognition camera 33. Next, the calculation processing unit 51 instructs the image processing unit 57 to perform recognition of the electronic component suctioned by the mounting head 28. The image processing unit 57 causes the component recognition camera 33 to capture an image of the suctioned electronic component, generates image data for the captured electronic component, and confirms the suctioning of the electronic component, and moreover detects the suctioned state of the electronic component by the mounting head 28 (for example, the suction position, angle, and the like, of the electronic component). The calculation processing unit 51 acquires from the image processing unit 57 the information relating to the confirmation of suctioning of the electronic component and the suctioned state thus detected, and then terminates the execution of the component recognition process. By means of this processing, if suctioning of the electronic component is not confirmed, the sequence operations of the component mounting apparatus 1 are halted and a component suction failure is transmitted to the operator, by executing process commands which are not illustrated, and the system then waits to return to normal operation.

After the component recognition process in step S14 above, the calculation processing unit 51 executes a component suctioning process in step S15. In this component suctioning process, the calculation processing unit 51 refers to the mounting data in the setting parameters in FIG. 5, and acquires data relating to the mounting coordinates X, Y, R of the electronic component to be mounted on the circuit board CB by the first standard sequence operation. The calculation processing unit 51 controls driving of the Y axis motor 25 and X axis motor 27 via the motor control unit 55, thereby causing the mounting head 28 of the head unit 23 to move to a position indicated by the mounting coordinates X,Y. After this movement of the head unit, the calculation processing unit 51 controls driving of the R axis motor 31 in accordance with the acquired mounting coordinate R via the motor control unit 55, so as to rotate the mounting head 28 by the angle indicated by the mounting coordinate R. In this case, if the suction coordinate R is "0", the mounting head 28 is not rotated.

Next, the calculation processing unit 51 controls driving of the Z axis motor 32 via the motor control unit 55 so as to lower the mounting head 28, and also controls the negative pressure generator 28a of the suction nozzle so as to mount the electronic component on the circuit board CB. In the control of the movement and rotation of the mounting head 28, the movement position and rotational position of the mounting head 28 is corrected by using state information for the circuit board CB which is acquired using the board recognition camera 34 by the board inward conveyance process in step S11 and suctioned state information for the electronic component which is acquired using the component recognition camera 33 by the component recognition process in step S14.

After the component mounting process in step S15, the operational sequence supervision unit 52 refers to, in step S16, the sequence data in the setting parameters in FIG. 5 and judges whether mounting of all electronic components onto the circuit board CB has been completed. If the mounting of all of the electronic components has not been completed, then the operational sequence supervision unit 52 judges "No" at step S16 and returns to step S11, and the processing in steps S11 to S15 described above is carried out again. In this case, only the first standard sequence operation in the sequence data has been completed, so in the present embodiment, the operational sequence supervision unit 52 judges "standard" again at step S12 after the board inward conveyance process in step S11 described above (see the sequence data in FIG. 5). By this means, standard sequence operations relating to a second electronic component, consisting of the component suctioning process, component recognition process and component mounting process in steps S13 to S15, are executed. If "No" is judged again at step S16, then the board inward conveyance process in step S11 is carried out. In the present embodiment, the third item in the sequence data specifies a custom program "CheckAccuracy" (custom program specification information). Therefore, the operational sequence supervision unit 52 judges "custom" at step S12, and sends an instruction for switching to an interpreter language processing execution routine (switching process) to the calculation processing unit 51. Upon receiving this, the calculation processing unit 51 executes the "special interpreter language processing execution routine" in step S17, during the repeated execution of the series of sequence operations.

The "special interpreter language processing execution routine" is a process for executing a custom program which has been created in an interpreter language, such as that shown in FIG. 6, for example. This "special interpreter language processing execution routine" constitutes a portion of the operational sequence supervision procedure in FIG. 3, and is created in compiler language. The details of the "special interpreter language processing execution routine" are indicated in the flowchart in FIG. 4. After starting execution in step S100, the calculation processing unit 51 executes the processing in steps S101 to S104, in accordance with the sequence specified by the operational sequence supervision unit 52.

In step S101, a program execution start line is specified in order to execute the next command in the custom program. In this processing in step S101, in many cases, a command stated in the next line after the line where the previous command was executed is specified as the execution start line, but if the next command is a jump command, for instance, then a command stated in a line other than the next line after the line where the previous command was executed is specified as the execution start line. In step S102, it is judged whether or not the execution start line thus specified is an "End" command indicating the end of execution of the custom program. If it is not an "End" command, then the calculation processing unit 51 judges "No" at step S102, one line of language, which is the execution start line specified in step S103, is interpreted, and a command based on this interpreted line of language is executed in step S104. Thereupon, the calculation processing unit 51 returns to step S101 and repeats the cycle of processing in steps S101 to S104 continuously, until an "End" command appears in the next execution start line. On the other hand, if an "End" command appears in the next execution start line, then the calculation processing unit 51 judges "Yes" at step S102, and in step S105, terminates the execution of the "special interpreter language processing execution routine".

By executing the "special interpreter language processing execution routine", a custom program created in interpreter language is executed. In the case of the present embodiment, this custom program is "CheckAccuracy" shown in FIG. 6. By executing this custom program "CheckAccuracy", as stated above, an image of the mounting coordinates position of the electronic component on the circuit board CB is captured with the board recognition camera 34, the captured image is processed, and it is judged whether or not the electronic component is mounted accurately at the correct position on the circuit board CB. If the judgment result is not "accurate", then the electronic component mounting sequence operation is halted. The mounting coordinates position of the electronic component in this case is the mounting position of the second electronic component. By executing a processing command which is not illustrated, this sequence operation of the component mounting apparatus is halted, a component mounting failure is transmitted to the operator, and the system then waits for a return to normal operation.

Figure 3:
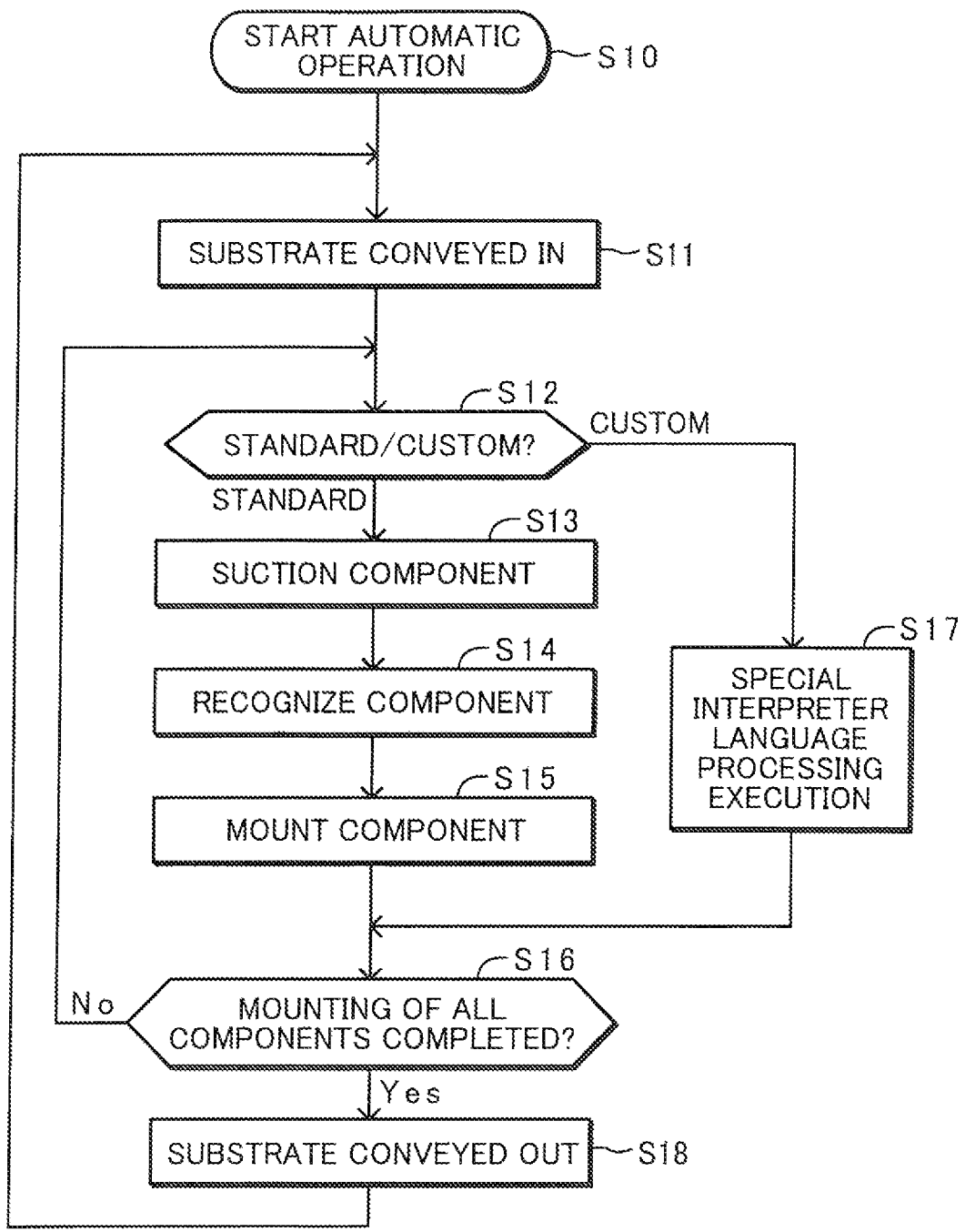
FIG. 3 is a flowchart showing an operational sequence which is executed by the component mounting apparatus relating to the first embodiment.

Returning again to the description in FIG. 3, after the execution of the "special interpreter language processing execution routine" has been completed, at step S16, the operational sequence supervision unit 52 again judges whether or not mounting of all of the electronic components onto the circuit board CB has been completed. If mounting of all of the electronic components onto the circuit board CB has not been completed, then the calculation processing unit 51 returns to step S12, due to the operational sequence supervision unit 52 returning a "No" judgment again at step S16, and the cycle of processing in steps S12 to S17 described above is repeated until mounting of all of the electronic components onto the circuit board CB has been completed. In the present embodiment, from the fourth item onwards of the sequence data in the setting parameters in FIG. 5, there are no custom programs and standard sequence operations are set successively; therefore, the specified standard sequence operations are successively carried out repeatedly by the cycle of processing in steps S12 to S16 in FIG. 3.

When the standard sequence operations stated in the sequence data of the setting parameters in FIG. 5 have all been completed, the calculation processing unit 51 executes a board outward conveyance process in step S18, due to the judgment result from the operational sequence supervision unit 52 which returns a "Yes" judgment at step S16. In this board outward conveyance process, the calculation processing unit 51 executes outward conveyance of the circuit board CB. After the outward conveyance of the board in step S18, the calculation processing unit 51 returns to the board inward conveyance process in step S11 and executes the cycle of processing in steps S11 to S18 described above to successively repeat processing for conveying a new circuit board CB into the apparatus, mounting electronic components onto the board and then conveying the board out from the apparatus.

FIG. 7 shows a sequence operation diagram of a component mounting apparatus 1 based on the operational sequence in FIG. 3. In other words, in the component mounting apparatus 1, after the start of automatic operation (SQ10), a sequence operation consisting of the following steps is executed repeatedly: inward conveyance of a circuit board CB (SQ11), standard suctioning and mounting of electronic component 1 (SQ12), standard suctioning and mounting of electronic component 2 (SQ13), mounting accuracy check for electronic component 2 (SQ14), standard suctioning and mounting of electronic component 3 (SQ15), . . . , outward conveyance of the circuit board CB (SQ19). This sequence operation is halted when the operator instructs an operational halt to the component mounting apparatus 1.

In the first embodiment where operation is carried out as described above, standard sequence operations of suctioning, recognizing and mounting an electronic component are executed by the processing in steps S13 to S15 of the sequence which is specified by the operational sequence supervision unit 52 written in compiler language, and the electronic component is mounted on the circuit board CB, whereby standard sequence operations in which the electronic component is mounted on the circuit board CB are executed at a fast speed. Furthermore, the operational sequence supervision process includes a "special interpreter language processing execution routine" in step S17 for executing a custom program which specifies an operation that is different to the standard sequence operations. Moreover, the operational sequence supervision process is specified by the sequence data in the setting parameters in FIG. 5, and includes the judgment process in step S12 for judging whether to execute the standard sequence or whether to execute the "special interpreter language processing execution routine", instead of the series of standard sequences described above. In this case, the custom program is written in interpreter language, and therefore the custom program can be created relatively easily. Since this custom program is executed appropriately in consecutive fashion after a sequence specified by the operational sequence supervision process which is written in compiler language, then it is possible to respond accurately to many and varied surface mounting manufacturing processes. In particular, a user is also able to achieve a user-specific sequence operation relatively easily by a custom program, so as to respond accurately to many and varied surface mounting manufacturing processes.

Second Embodiment

Figure 8:
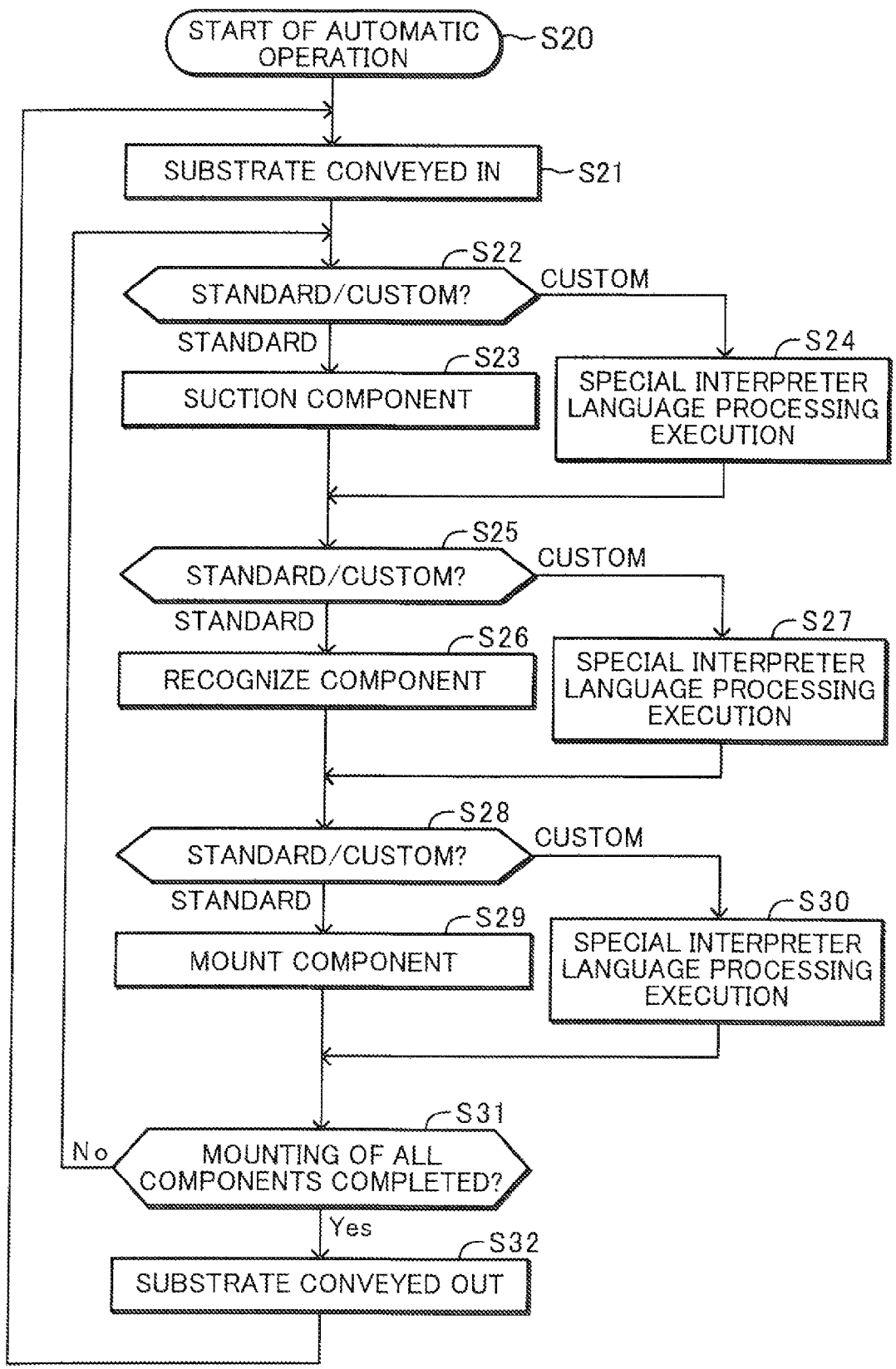
FIG. 8 is a flowchart showing an operational sequence which is executed by the component mounting apparatus relating to a second embodiment.

Next, a second embodiment of the present invention will be described. The composition of the component mounting apparatus 1 relating to this second embodiment is the same as the compositional example in FIGS. 1 and 2 described above. The second embodiment includes the operational sequence supervision procedure in FIG. 8 which includes the "special interpreter language processing execution routine" in FIG. 4. In the present embodiment, the operational sequence supervision processing is created in compiler language, and basically, controls a sequence for causing the component mounting apparatus 1 to repeatedly execute a standard sequence operation consisting of suctioning, recognizing and mounting electronic components, and during the repeated execution of the standard sequence, specifies the execution of a "special interpreter language processing execution routine" instead of the respective processes of suctioning, recognizing and mounting the electronic components. Furthermore, in the present embodiment, the "special interpreter language processing execution routine" is a routine for causing the component mounting apparatus to execute a custom program, which is described below.

The setting parameters shown in FIG. 9 are stored in the setting parameter memory unit 53, and the custom program shown in FIG. 10 is stored in the custom program memory unit 54. The setting parameters includes: mounting coordinates and mounting sequence data, component data, and sequence data.

The mounting coordinates and the mounting sequence data consist of mounting coordinates X,Y,R and a mounting number similar to the first embodiment described above, in the order of mounting onto the circuit board CB according to the standard sequence. The component data consists of a sequence (standard or number) which specifies either a standard sequence or a special sequence, in addition to suction coordinates X,Y,R and a suctioning and mounting action similar to the first embodiment described above, which are associated respectively with each mounting number.

The sequence data is data associated respectively with each special sequence number in the component data, which indicates whether the suctioning, recognition and mounting of the electronic components is to be based on a standard sequence or a special sequence which is different from the standard sequence. If the sequence data indicates that the sequence is a special sequence, then a program name of the custom program which specifies a special sequence for each of the suction sequence, the recognition sequence and the mounting sequence, is stated in the sequence data, in association with a number indicating the special sequence. In the present embodiment, "Adapt Polarity" (a polarity adapting suction program) is stated for the suction sequence of the second electronic component, and the corresponding custom program is stored in the custom program memory unit 54.

The custom program is created in interpreter language and is a program which causes the component mounting apparatus to execute a sequence operation which is different to the standard sequence operations of suctioning, recognizing and mounting an electronic component. The custom program "AdaptPolarity" shown in FIG. 10 is one example, which controls the mounting head 28 either so as to suction an electronic component after rotating through 180 degrees or so as to suction the electronic component directly without rotating, when suctioning an electronic component which has been supplied on a feeder 11. More specifically, in this control procedure, a suction camera (in this case, a board recognition camera 34) is moved to a position of an electronic component which has been supplied on a feeder 11 and is to be suctioned, in other words, a position specified by the suction coordinates X,Y, and captures an image of the electronic component. The captured image is processed and it is judged whether to suction the electronic component after turning the mounting head 28 through 180 degrees or whether to suction the electronic component directly without rotation. In accordance with the result of this judgment, an electronic component is suctioned either by rotating the mounting head 28 through 180 degrees or without rotating the head. The suction operation is as described in the first embodiment explained above.

Next, the operation of a component mounting apparatus 1 relating to a second embodiment which has been composed in this way will be described. When the start of execution of a component mounting program is instructed, the calculation processing unit 51 starts automatic operation of the component mounting apparatus at step S20 in FIG. 8, and the cycle of processing consisting of steps S21 to S32 is carried out repeatedly. In this case, the board inward conveyance process in step S21 and the board outward conveyance process in step S32 are the same as the board inward conveyance process in step S11 of FIG. 3 according to the first embodiment and the board outward conveyance process in step S18. Moreover, the component suctioning process in step S23, the component recognition process in step S26, the component mounting process in step S29 and the all component mounting completion judgment process in step S31 are the same as the component suctioning process in step S13, the component recognition process in step S14, the component mounting process in step S15 and the all component mounting completion judgment process in step S16 which are shown in FIG. 3 relating to the first embodiment.

In steps S22, S25 and S28, the operational sequence supervision unit 52 carries out a judgment process to judge whether to execute a standard sequence or to switch to and execute a custom sequence (custom program). If it is judged that a standard sequence is to be executed, then when the circuit board CB is conveyed into the apparatus, processing is executed repeatedly for mounting electronic components in the specified mounting number order, in accordance with the mounting coordinates, the mounting order data and the component data in FIG. 9, and then conveying the board out from the apparatus.

In the judgment process in steps S22, S25 and S28, it is judged whether or not the sequence in the component data in FIG. 9 indicates a number representing a special sequence, rather than a standard sequence. Simultaneously with this judgment process, in the judgment process in step S22, it is judged whether or not a custom program name has been stored in the suction sequence column corresponding to the aforementioned number in the sequence data in FIG. 9. In the judgment process in step S25, it is judged whether or not a custom program name has been stored in the recognition sequence column corresponding to the aforementioned number in the sequence data in FIG. 9. In the judgment process in step S28, it is judged whether or not a custom program name has been stored in the mounting sequence column corresponding to the aforementioned number in the sequence data in FIG. 9.

If a number representing a special sequence has been stored in the component data and a custom program name has been stored in the suction sequence column corresponding to the number, then the operational sequence supervision unit 52 judges that a custom operation is to be executed in step S22. Based on this judgment result of the operational sequence supervision unit 52, the calculation processing unit 51 executes the "special interpreter language processing execution routine" in step S24, instead of the component suctioning process in step S23. Furthermore, if a number representing a special sequence has been stored in the component data and a custom program name has been stored in the recognition sequence column corresponding to the number, then the operational sequence supervision unit 52 judges that a custom operation is to be executed in step S25. Based on this judgment result of the operational sequence supervision unit 52, the calculation processing unit 51 executes the "special interpreter language processing execution routine" in step S27, instead of the component recognition process in step S26. Furthermore, if a number representing a special sequence has been stored in the component data and a custom program name has been stored in the mounting sequence column corresponding to the number, then the operational sequence supervision unit 52 judges that a custom operation is to be executed in step S28. Based on this judgment result of the operational sequence supervision unit 52, the calculation processing unit 51 executes the "special interpreter language processing execution routine" in step S30, instead of the component mounting process in step S29.

Figure 4:
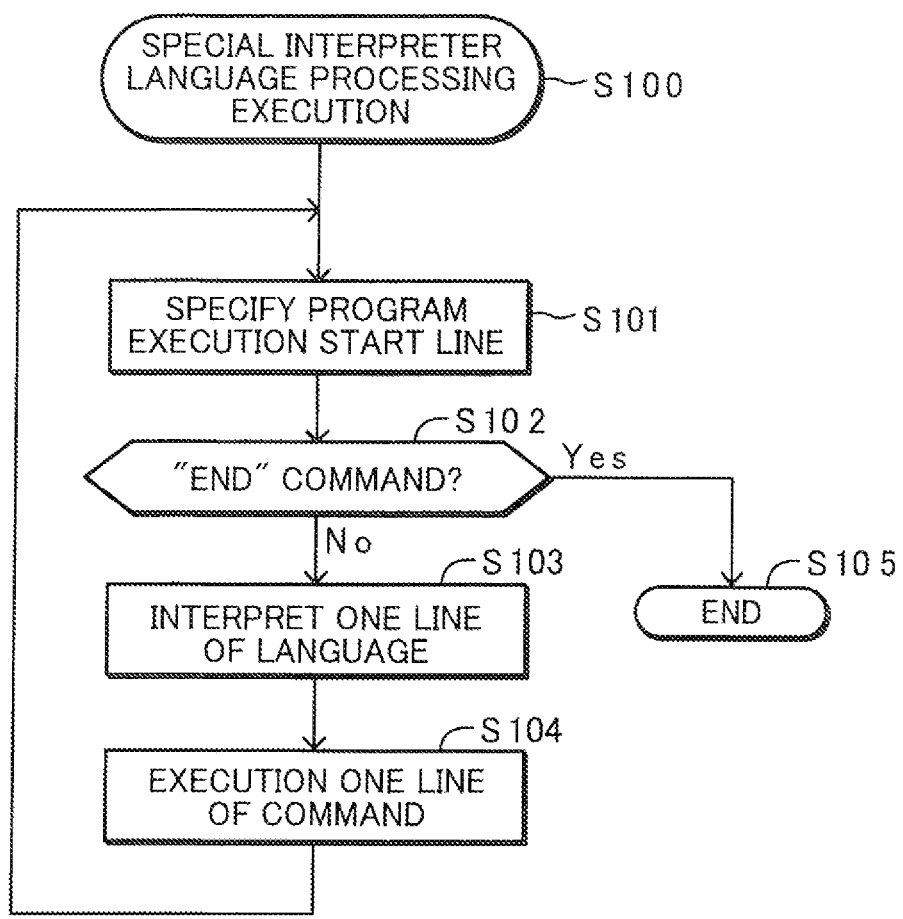
FIG. 4 is a flowchart showing details of a special interpreter language processing execution routine in an operational sequence supervision process provided in a component mounting apparatus relating to first to fifth embodiments of the invention.

The "special interpreter language processing execution routine" in steps S24, S27 and S30 is the same as the "special interpreter language processing execution routine" shown in FIG. 4 and described in the first embodiment above. The point of difference is the custom program that is executed. In the present embodiment, as shown by the setting parameters in FIG. 9, the custom program "AdaptPolarity" is indicated in the suction sequence of the second electronic component (electronic component 2) only.

Figure 11:
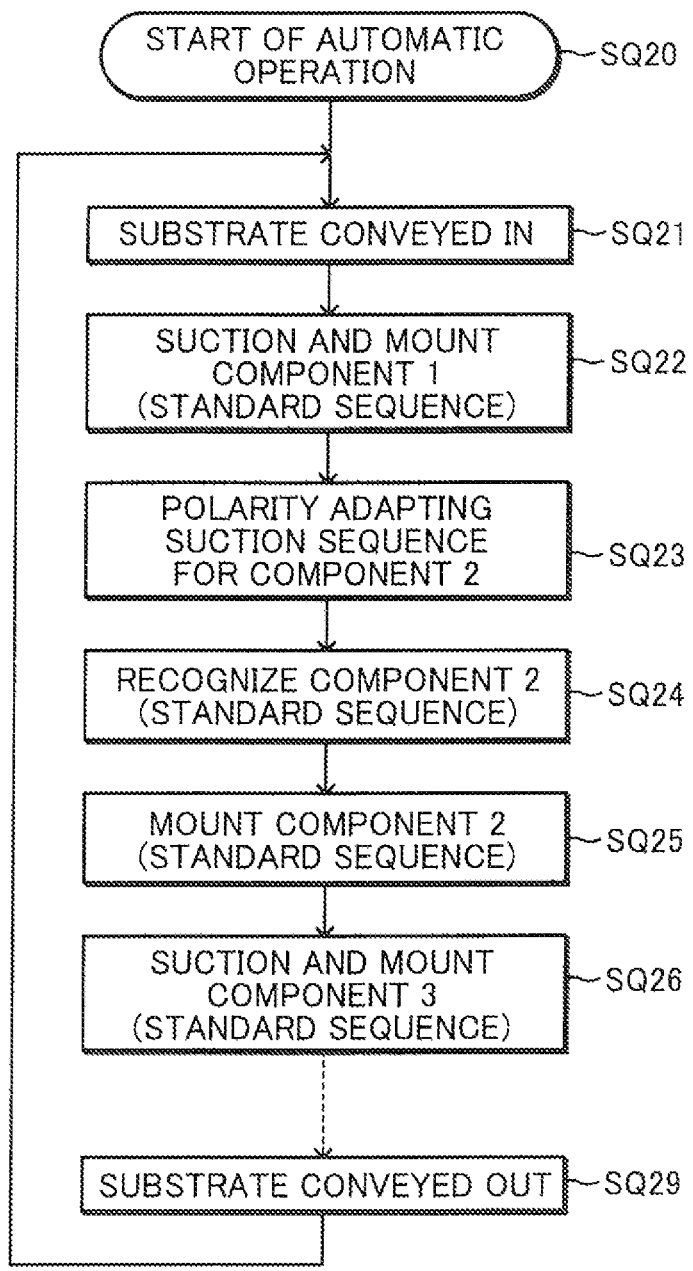
FIG. 11 is a sequence operation diagram of a component mounting apparatus relating to the second embodiment.

Therefore, as indicated by the sequence operation diagram in FIG. 11, after the start of automatic operation (SQ20), a sequence operation consisting of the following steps is executed repeatedly: inward conveyance of circuit board CB (SQ21), standard suctioning and mounting of an electronic component 1 (SQ22), polarity adapting suctioning and mounting sequence ("AdaptPolarity") for electronic component 2 (SQ23), standard recognition for electronic component 2 (SQ24), standard mounting of electronic component 2 (SQ25), standard suctioning and mounting of electronic component 3 (SQ26), . . . , and outward conveyance of the circuit board CB (SQ29). In this case also, the aforementioned sequence operation is halted when the operator instructs an operational halt to the component mounting apparatus. By executing the custom program "AdaptPolarity" (instead of a standard suctioning sequence) in respect of the electronic component 2 in SQ23 above, then as stated previously, the suctioning process for the electronic component 2 is changed to a special suctioning process in which the mounting head 28 either suctions the electronic component after rotating through 180 degrees, or suctions the electronic component directly without rotation.

In the second embodiment which operates as described above, as well, by the processing in steps S23, S26 and S29 of the sequence which is specified by an operational sequence supervision process that is written in compiler language, standard sequence operations of suctioning, recognizing and mounting electronic components are carried out and electronic components are mounted on a circuit board CB. Therefore, standard sequence operations for mounting electronic components on a circuit board CB are carried out at high speed. Furthermore, the operational sequence supervision process also includes the "special interpreter language processing execution routine" in steps S24, S27, S30 for executing a custom program which specifies an operation that is different to a standard sequence operation, as well as including the judgment process in steps S22, S25 and S28 for judging whether to execute the standard sequence or whether to execute the "special interpreter language processing execution routine", instead of the series of standard sequences, as designated by the sequence data in the setting parameters in FIG. 9. A special custom program may be executed respectively instead of the suctioning, recognition and mounting of the electronic components which are the standard sequence operations. Since the custom program is written in interpreter language, then similarly to the case of the first embodiment described above, it is possible to respond accurately to many, varied surface mounting manufacturing processes.

This second embodiment only describes a custom program which specifies a special suction sequence operation in place of a standard suction sequence operation. However, it is also possible to store custom programs which execute a special component recognition sequence operation and a special component mounting sequence operation, instead of the standard component recognition sequence operation and the standard component mounting sequence operation, and to cause these custom programs to be executed by means of the processing in steps S27 and S30. In this case, an electronic component suctioning abnormality is detected by a special recognition sequence, in a custom program which executes a special component recognition sequence operation. For example, an image of a suctioned electronic component is captured a plurality of times, the images are processed, and an electronic component suctioning abnormality can be detected by the average of the plurality of image processing results, or an electronic component suctioning abnormality can be detected by using a special recognition apparatus. Furthermore, in a custom program for executing a special component mounting sequence operation, for example, a foreign object on a circuit board CB is detected from a captured image of the circuit board CB. In this case also, a plurality of images of the circuit board CB are captured, the images are processed, and an abnormality on the circuit board CB can be detected by the average of the plurality of image processing results, or an abnormality on the circuit board CB can be detected by using a special recognition apparatus.

Third Embodiment

Figure 12:
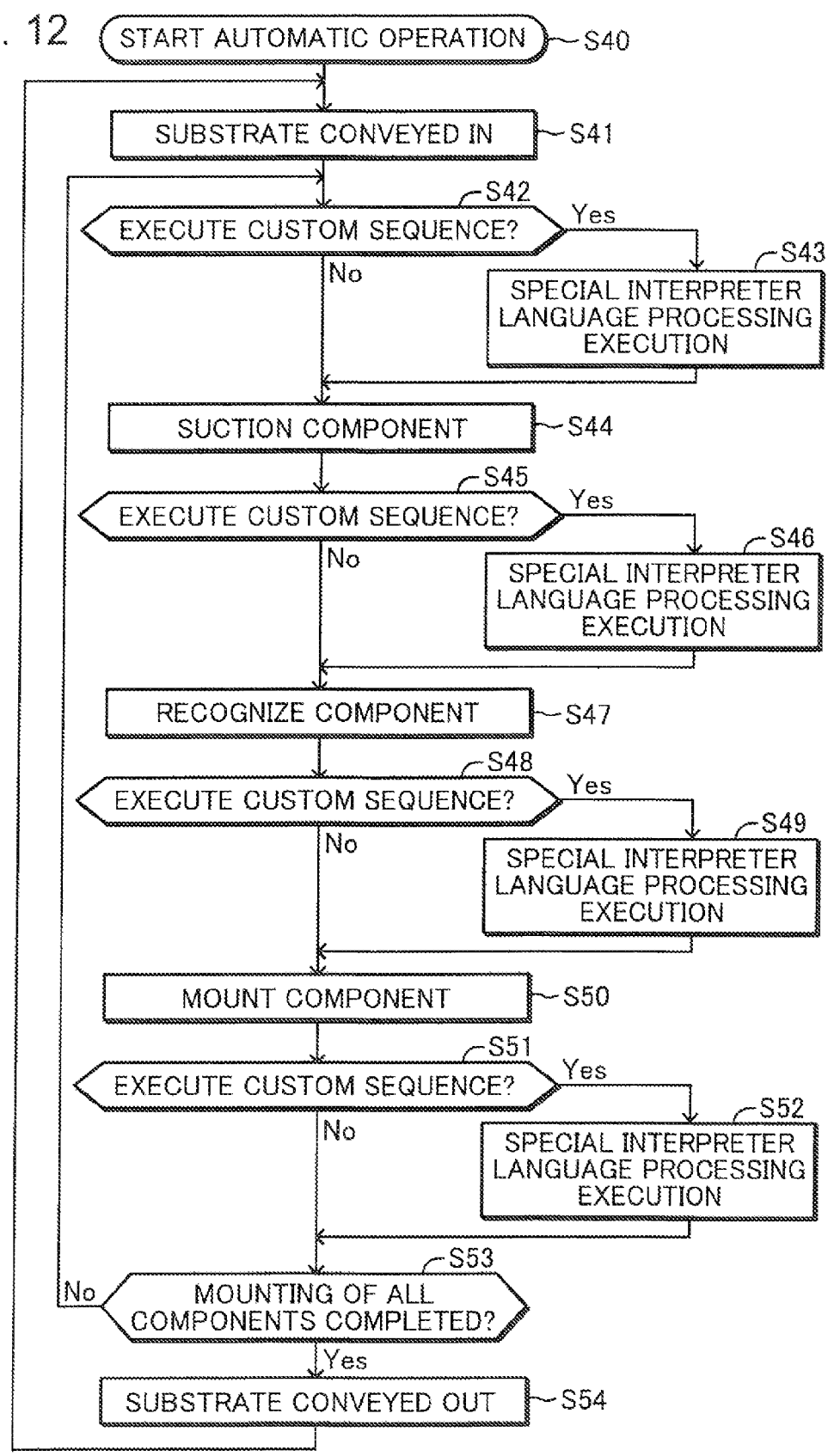
FIG. 12 is a flowchart showing an operational sequence which is executed by the component mounting apparatus relating to a third embodiment.

Next, a third embodiment of the present invention will be described. The composition of the component mounting apparatus 1 relating to this third embodiment is the same as the compositional example in FIGS. 1 and 2 described above. The third embodiment comprises the operational sequence supervision procedure in FIG. 12 which includes the "special interpreter language processing execution routine" in FIG. 4. In the present embodiment, the operational sequence supervision procedure is created in compiler language, and basically, controls a sequence for causing the component mounting apparatus 1 to repeatedly execute standard sequence operations consisting of suctioning, recognizing and mounting electronic components, and during the repeated execution of the standard sequence, specifies the execution of a "special interpreter language processing execution routine", as necessary, before or after the respective processes of suctioning, recognizing and mounting the electronic components. In the present embodiment, the "special interpreter language processing execution routine" is a routine for causing the component mounting apparatus to execute a custom program, which is described below.

The setting parameters shown in FIG. 13 are stored in the setting parameter memory unit 53, and the custom program shown in FIG. 14 is stored in the custom program memory unit 54. In this case also, the setting parameters comprise: mounting coordinates and mounting sequence data, component data, and sequence data. The mounting coordinates and mounting order data and the component data are the same as the case of the second embodiment described above.

The sequence data differs from the case of the second embodiment described above in being data which indicates whether to execute a special sequence which is different from a standard sequence, before an electronic component suctioning sequence, before an electronic component recognition sequence, before an electronic component mounting sequence or after an electronic component mounting sequence. If a special sequence is executed, then a program name of a custom program specifying the special sequence operation is stated in the sequence data, for example, before the electronic component suction sequence or before the electronic component recognition sequence, before the electronic component mounting sequence or after the electronic component mounting sequence. In the case of the present embodiment, "DipAction" (a transfer operation program) is stated in the column before the recognition sequence, for example.

The custom program is created in interpreter language and is a program which causes the component mounting apparatus to execute a sequence operation which is different to the standard sequence operation of suctioning, recognizing and mounting an electronic component. In the example of the setting parameters in FIG. 13, the custom program name "DipAction" is stated in the column before the recognition sequence of the second electronic component. This custom program "DipAction" is shown in FIG. 14, and carries out special processing on the electronic component suctioned by the mounting head 28, after an electronic component supplied from the feeder 11 has been suctioned. More specifically, in this control procedure, the mounting head 28 which has suctioned an electronic component is moved to a coordinates position X,Y where flux to be coated onto the electrodes of the electronic component has been prepared, the mounting head 28 is moved in the Z axis direction (downwards), flux is coated onto the electrodes of the electronic component, and the mounting head 28 is then moved in the Z axis direction (upwards). Here, "flux" means a pre-soldering paste which is used to expand wetting of the solder when the electrodes of the electronic component and the electrodes on the circuit board CB are connected electrically in a reflow machine at a subsequent stage.

Next, the operation of a component mounting apparatus relating to a third embodiment which has been composed in this way will be described. When the start of execution of a component mounting program is instructed, the calculation processing unit 51 starts automatic operation of the component mounting apparatus at step S40 in FIG. 12, and the cycle of processing consisting of steps S41 to S54 is carried out repeatedly. In this case, the board inward conveyance process in step S41 and the board outward conveyance process in step S54 are the same as the board inward conveyance process in step S11 and the board outward conveyance process in step S18 shown in FIG. 3 relating to the first embodiment. Moreover, the component suctioning process in step S44, the component recognition process in step S47, the component mounting process in step S50 and the all component mounting completion judgment process in step S53 are the same as the component suctioning process in step S13, the component recognition process in step S14, the component mounting process in step S15 and the all component mounting completion judgment process in step S16 shown in FIG. 3 relating to the first embodiment.

The operational sequence supervision unit 52 carries out a judgment process about whether or not to carry out a custom sequence (a custom program), in steps S42, S45, S48 and S51. If it is not judged that a custom sequence is to be intercalated, then when a new circuit board CB is conveyed into the apparatus, processing is executed repeatedly for mounting electronic components in the specified mounting number order, in accordance with the mounting coordinates, the mounting order data and the component data in FIG. 13, and then conveying the board out from the apparatus.

In the judgment process in steps S42, S45, S48 and S51, it is judged whether or not the sequence in the component data in FIG. 13 indicates a number representing a special sequence, rather than a standard sequence. Simultaneously with this judgment process, in the judgment process in step S42, it is judged whether or not a custom program name has been stored in the column before the suction sequence corresponding to the aforementioned number in the sequence data in FIG. 13. In the judgment process in step S45, it is judged whether or not a custom program name has been stored in the column before the recognition sequence corresponding to the aforementioned number in the sequence data in FIG. 13. In the judgment process in step S48, it is judged whether or not a custom program name has been stored in the column before the mounting sequence corresponding to the aforementioned number in the sequence data in FIG. 13. In the judgment process in step S51, it is judged whether or not a custom program name has been stored in the column after the mounting sequence corresponding to the aforementioned number in the sequence data in FIG. 13.

If a number representing a special sequence has been stored in the component data and a custom program name has been stored in the column before the suction sequence corresponding to the number, then the operational sequence supervision unit 52 judges that a custom sequence is to be executed in step S42. Based on this judgment result of the operational sequence supervision unit 52, the calculation processing unit 51 executes the "special interpreter language processing execution routine" in step S43, before the component mounting process in step S44. Furthermore, if a number representing a special sequence has been stored in the component data and a custom program name has been stored in the column before the recognition sequence corresponding to the number, then the operational sequence supervision unit 52 judges that a custom sequence is to be executed in step S45. Based on this judgment result of the operational sequence supervision unit 52, the calculation processing unit 51 executes the "special interpreter language processing execution routine" in step S46, before the component recognition process in step S47. Furthermore, if a number representing a special sequence has been stored in the component data and a custom program name has been stored in the column before the mounting sequence corresponding to the number, then the operational sequence supervision unit 52 judges that a custom sequence is to be executed in step S48. Based on this judgment result of the operational sequence supervision unit 52, the calculation processing unit 51 executes the "special interpreter language processing execution routine" in step S49, before the component mounting process in step S50. Moreover, if a number representing a special sequence has been stored in the component data and a custom program name has been stored in the column after the mounting sequence corresponding to the number, then the operational sequence supervision unit 52 judges that a custom sequence is to be executed in step S41. Based on this judgment result of the operational sequence supervision unit 52, the calculation processing unit 51 executes the "special interpreter language processing execution routine" in step S52, before the all component mounting completion judgment process in step S53.

The "special interpreter language processing execution routine" in steps S43, S46, S49 and S52 is the same as the "special interpreter language processing execution routine" shown in FIG. 4 and described in the first embodiment above.

The point of difference is the custom program that is executed. In the present embodiment, as shown by the setting parameters in FIG. 13, the custom program "DipAction" is indicated in the recognition process of the second electronic component (electronic component 2) only.

Therefore, as indicated by the sequence operation diagram in FIG. 15, after the start of automatic operation (SQ30), a sequence operation consisting of the following steps is executed repeatedly: inward conveyance of circuit board CB (SQ31), standard suctioning and mounting of an electronic component 1 (SQ32), standard suctioning of an electronic component 2 (SQ33), a flux transfer sequence for electronic component 2 (custom program "DipAction") (SQ34), standard recognition of electronic component 2 (SQ35), standard mounting of electronic component 2 (SQ36), standard suctioning and mounting of electronic component 3 (SQ37), . . . , and outward conveyance of the circuit board CB (SQ39). In this case also, the aforementioned sequence operation is halted when the operator instructs an operational halt to the component mounting apparatus 1. By executing the custom program "DipAction" in SQ34 described above, before the standard recognition sequence for the electronic component 2, then as stated previously, a special intercalated process is carried out for coating flux onto the electrodes of the electronic component which has been suctioned.

In the third embodiment which operates as described above, as well, by the processing in steps S44, S47 and S50 of the sequence which is specified by the operational sequence supervision process written in compiler language, standard sequence operations of suctioning, recognizing and mounting electronic components are carried out and electronic components are mounted on a circuit board CB. Therefore, standard sequence operations for mounting electronic components on a circuit board CB are carried out at high speed. Furthermore, the operational sequence supervision process also includes the "special interpreter language processing execution routine" in steps S43, S46, S49 and S52 for executing a custom program which specifies an operation that is different to a standard sequence operation, as well as including the judgment process in steps S42, S45, S48 and S51 for judging whether to execute the "special interpreter language processing execution routine", before or after the respective processes of suctioning, recognizing and mounting an electronic component, as designated by the sequence data in the setting parameters in FIG. 13. A special custom program may be executed respectively before or after the suctioning, recognition and mounting of the electronic components which are the standard sequence operations. Furthermore, in this case also, since the custom program is written in interpreter language, then similarly to the case of the first embodiment described above, it is possible to respond accurately to many, varied surface mounting manufacturing processes.

This third embodiment only describes a case where a custom program specifying a special sequence (a sequence for coating flux onto the electrodes of the electronic component) is executed before recognition of the electronic component. However, it is also possible to carry out a special detection operation for an electronic component suction abnormality as described in the modification example of the second embodiment described above, as a special sequence before the recognition of the electronic component.

Furthermore, it is also possible to execute a custom program which specifies a special sequence operation that is different to the standard sequence operations of suctioning, recognizing and mounting an electronic component, either before suctioning of an electronic component, or before mounting of an electronic component, or after mounting of an electronic component. In this case, for example, it is also possible to carry out a special inspection of an electronic component which has been supplied by the feeder 11, using the board recognition camera 34, by means of the "special interpreter language processing execution routine" in step S43, before suctioning the electronic component. Moreover, it is also possible to carry out detection of foreign matter on the circuit board CB or special detection of abnormalities on the circuit board CB, by capturing an image of the circuit board CB in the "special interpreter language processing execution routine" in step S49, before mounting the electronic component. Furthermore, it is also possible to inspect the accuracy of mounting of an electronic component onto the circuit board CB which was executed in the first embodiment, by means of the "special interpreter language processing execution routine" in step S52, after mounting the electronic component. Moreover, it is also possible to carry out cleaning of the suction nozzle which is executed as a special sequence in the fourth and fifth embodiments described below, by means of the "special interpreter language processing execution routine" in step S52, after mounting the electronic component.

Fourth Embodiment

Next, a fourth embodiment of the present invention will be described. The composition of the component mounting apparatus 1 relating to this fourth embodiment is the same as the compositional example in FIGS. 1 and 2 described above. The fourth embodiment includes the operational sequence supervision procedure in FIG. 16 which includes the "special interpreter language processing execution routine" in FIG. 4. In the present embodiment, the operational sequence supervision procedure is created in compiler language, and basically, controls a sequence for causing the component mounting apparatus 1 to repeatedly execute standard sequence operations consisting of suctioning, recognizing and mounting electronic components, and specifies the execution of a "special interpreter language processing execution routine", as necessary, after the mounting of all electronic components has been completed. In the present embodiment, the "special interpreter language processing execution routine" is a routine for causing the component mounting apparatus to execute a custom program, which is described below.

The setting parameters shown in FIG. 17 are stored in the setting parameter memory unit 53, and the custom program shown in FIG. 18 is stored in the custom program memory unit 54. The setting parameters includes: mounting coordinates and mounting sequence data, component data, and a sequence during board conveyance. The mounting coordinates, mounting order data and component data are substantially the same as the second and third embodiments described above, and the only difference with respect to the second and third embodiments given above is that there is no sequence in the component data.

When a special sequence operation which is different to a standard sequence operation of suctioning, recognizing and mounting the electronic components is to be carried out during inward conveyance and outward conveyance of the circuit board CB, a program name of a custom program which specifies the special sequence operation is stated in the sequence during board conveyance. In the case of the present embodiment, for example, "Clean Nozzle" (a nozzle cleaning program) is stated as a sequence during board conveyance, and this custom program is stored in the custom program memory unit 54.

The custom program is created in interpreter language and is a program which causes the component mounting apparatus to execute a sequence operation which is different to the standard sequence operations of suctioning, recognizing and mounting an electronic component. In the example of the setting parameters in FIG. 17, the aforementioned custom program name "Clean Nozzle" is stored. As shown in FIG. 18, this custom program "CleanNozzle" moves the mounting head 28 (suction nozzle) to a coordinates position X,Y where cleaning liquid is situated, moves the mounting head 28 in the Z axis direction (downwards), cleans the mounting head 28 by immersion for a specified period of time in the cleaning liquid, and then moves the mounting head 28 in the Z axis direction (upwards).

Next, the operation of a component mounting apparatus relating to a fourth embodiment which has been composed in this way will be described. When the start of execution of a component mounting program is instructed, the calculation processing unit 51 starts automatic operation of the component mounting apparatus at step S60 in FIG. 16, and the cycle of processing consisting of steps S61 to S69 is carried out repeatedly. In this case, the board inward conveyance process in step S61 and the board outward conveyance process in step S69 are the same as the board inward conveyance process in step S11 and the board outward conveyance process in step S18 shown in FIG. 3 relating to the first embodiment. Moreover, the component suctioning process in step S63, the component recognition process in step S64, the component mounting process in step S65 and the all component mounting completion judgment process in step S66 are the same as the component suctioning process in step S13, the component recognition process in step S14, the component mounting process in step S15 and the all component mounting completion judgment process in step S16 which are shown in FIG. 3 relating to the first embodiment.

The operational sequence supervision unit 52 carries out a judgment process about whether or not to carry out a custom sequence (a custom program), in step S67. If it is judged that a custom sequence is not to be executed, then when the circuit board CB is conveyed into the apparatus, processing is executed repeatedly for mounting electronic components in the specified mounting number order, in accordance with the mounting coordinates, the mounting order data and the component data in FIG. 17, and then conveying the board out from the apparatus.

In the judgment process in step S67, it is judged whether or not a custom program name has been stated in the sequence during board conveyance in FIG. 17. If a custom program name is not stated in the sequence during board conveyance, then after judging that mounting of all of the electronic components has been completed at step S66, the calculation processing unit 51 starts execution of a "special interpreter language processing execution routine" in step S68, in accordance with the judgment result of the operational sequence supervision unit 52 which has judged "Yes", in other words, that a custom sequence is to be executed, in step S67.

The "special interpreter language processing execution routine" in step S68 is the same as the "special interpreter language processing execution routine" shown in FIG. 4 and described in the first embodiment above. In the present embodiment, in parallel with the execution of a custom program based on the processing of a "special interpreter language processing execution routine" (in this case, the custom program "CleanNozzle"), the board outward conveyance process in the subsequent step S69 and the board inward conveyance process in the following step S61 are also carried out. If the execution of the custom program "CleanNozzle" has not been completed even after the execution of the board inward conveyance process has ended, then the calculation processing unit 51 continues the execution of the judgment process in step S62, in accordance with the judgment result from the operational sequence supervision unit 52 which judges "No" at step S62, in other words, that the "special interpreter language processing execution routine" has not been completed.

Figure 16:
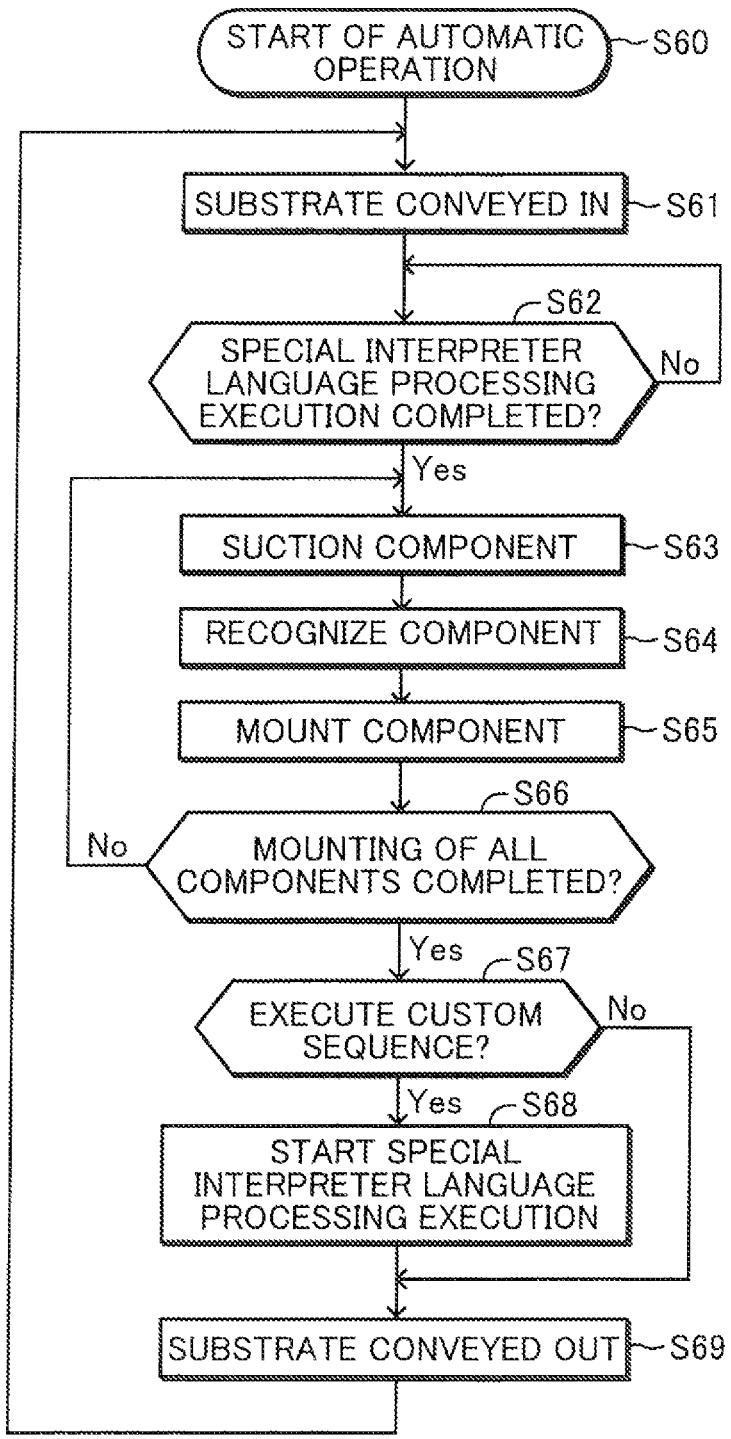
FIG. 16 is a flowchart showing an operational sequence which is executed by the component mounting apparatus relating to a fourth embodiment.

In the component mounting program according to the fourth embodiment in FIG. 16, if the custom program name is stated as a sequence during board conveyance, then a sequence operation according to the custom program (in this case, the custom program "CleanNozzle") is executed during the outward conveyance process of a circuit board CB after all of the electronic components have been mounted on a circuit board CB which has been conveyed into the apparatus, and during the next inward conveyance process. After completing the sequence operations based on this custom program, the standard sequence operations consisting of suctioning, recognizing and mounting electronic components are carried out repeatedly.

Figure 19:
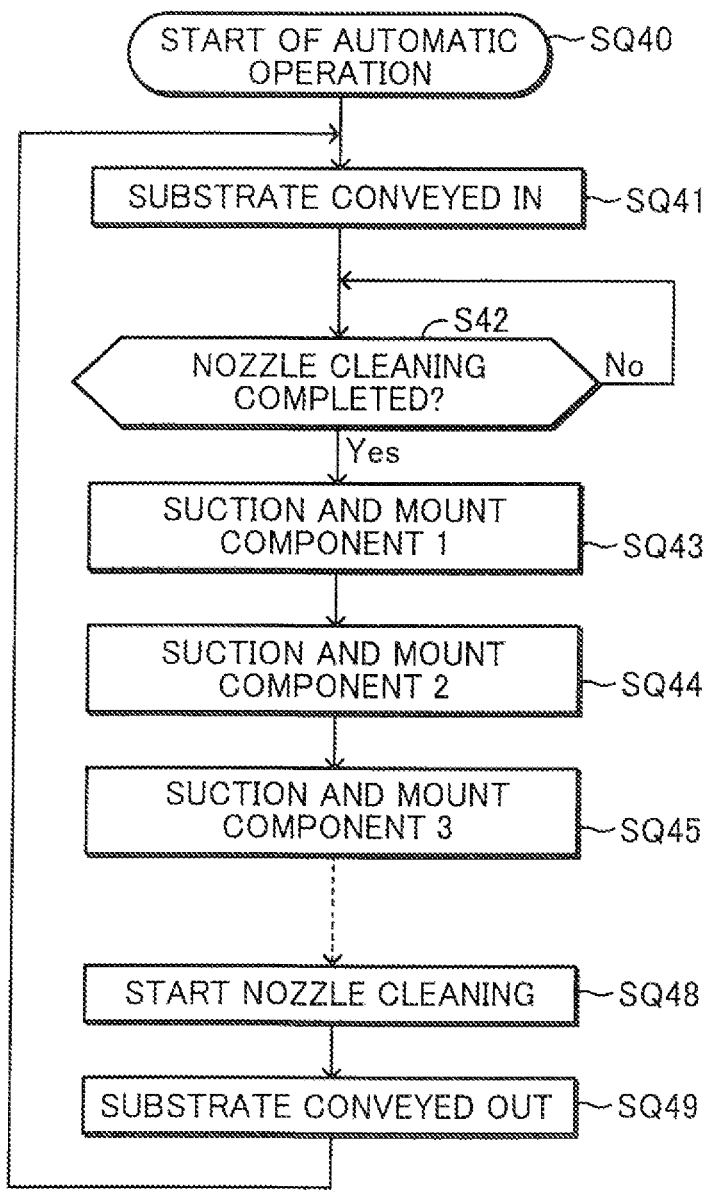
FIG. 19 is a sequence operation diagram of a component mounting apparatus relating to the fourth embodiment.

Therefore, as indicated by the sequence operation diagram in FIG. 19, after the start of automatic operation (SQ40), a sequence operation consisting of the following steps is executed repeatedly: inward conveyance of circuit board CB (SQ41), suction nozzle cleaning completion a judgment process (SQ42), standard suctioning and mounting of an electronic component 1 (SQ43), standard suctioning and mounting of electronic component 2 (SQ44), standard suctioning and mounting of electronic component 3 (SQ45), . . . , start of suction nozzle cleaning (SQ48) and outward conveyance of the circuit board CB (SQ49). In this case also, the aforementioned sequence operation is halted when the operator instructs an operational halt to the component mounting apparatus 1.

In the fourth embodiment which operates as described above, as well, by the processing in steps S63, S64 and S65 of the sequence which is specified by the operational sequence supervision process written in compiler language, standard sequence operations of suctioning, recognizing and mounting electronic components are carried out and electronic components are mounted on a circuit board CB. Therefore, standard sequence operations for mounting electronic components on a circuit board CB are carried out at high speed. Furthermore, the operational sequence supervision process also includes a process for starting the "special interpreter language processing execution routine" in step S68 in order to execute a custom program which specifies an operation that is different to a standard sequence operation, as well as including the judgment process in step S62 for judging whether to execute the "special interpreter language processing execution routine", during inward conveyance and outward conveyance of a circuit board CB, as designated by the sequence data in the setting parameters in FIG. 17. A special custom program may be executed respectively during the outward conveyance and inward conveyance of a circuit board CB, after the suctioning, recognition and mounting of the electronic components which are the standard sequence operations. Furthermore, since the custom program is written in interpreter language, then similarly to the case of the first embodiment described above, it is possible to respond accurately to many, varied surface mounting manufacturing processes.

Fifth Embodiment

Next, a fifth embodiment of the present invention will be described. The composition of the component mounting apparatus 1 relating to this fifth embodiment is the same as the compositional example in FIGS. 1 and 2 described above. The fifth embodiment includes the operational sequence supervision procedure in FIG. 20 which includes the "special interpreter language processing execution routine" in FIG. 4. In the present embodiment, the operational sequence supervision procedure is created in compiler language, and basically, controls a sequence for causing the component mounting apparatus 1 to repeatedly execute standard sequence operations consisting of suctioning, recognizing and mounting electronic components, and specifies the execution of a "special interpreter language processing execution routine", as necessary, at prescribed time intervals, during the standard sequence operations. In the present embodiment, the "special interpreter language processing execution routine" is a routine for causing the component mounting apparatus to execute a custom program, which is described below.

The setting parameters shown in FIG. 21 are stored in the setting parameter memory unit 53, and the custom program shown in FIG. 18 (the same as the custom program in the fourth embodiment described above) is stored in the custom program memory unit 54. The setting parameters includes: mounting coordinates and mounting sequence data, component data, and a periodic execution sequence. The mounting coordinates and mounting order data and the component data are the same as the case of the fourth embodiment described above.

The periodic execution sequence is included in place of the sequence during board conveyance of the fourth embodiment described above, and specifies a program name of a custom program which designates a special operation, and a time interval (specified time period) for executing this custom program, when a special sequence operation that is different from the standard sequence operations consisting of suctioning, recognizing and mounting electronic components is to be carried out. In the case of the present embodiment, the custom program is "CleanNozzle" (a nozzle cleaning program), which is the same as the fourth embodiment described above, for example, and the time interval for executing this custom program is 10 minutes, for example.

Next, the operation of a component mounting apparatus 1 relating to a fifth embodiment which has been composed in this way will be described. When the start of execution of a component mounting program is instructed, the calculation processing unit 51 starts automatic operation of the component mounting apparatus 1 at step S70 in FIG. 20, and the cycle of processing consisting of steps S71 to S80 is carried out repeatedly. In this case, the board inward conveyance process in step S71 and the board outward conveyance process in step S80 are the same as the board inward conveyance process in step S61 and the board outward conveyance process in step S69 shown in FIG. 3 relating to the fourth embodiment described above (in other words, the board inward conveyance process of step S11 and the board outward conveyance process of step S18 in FIG. 3 relating to the first embodiment described above). Furthermore the component suctioning process in step S73, the component recognition process in step S74, the component mounting process in step S75 and the all component mounting completion judgment process in step S79 are the same as the component suctioning process in step S63, the component recognition process in step S64, the component mounting process in step S65 and the all component mounting completion judgment process in step S66 in FIG. 3 relating to the fourth embodiment described above (in other words, the component suctioning process in step S13, the component recognition process in step S14, the component mounting process in step S15 and the all component mounting completion judgment process in step S16 in FIG. 3 relating to the first embodiment described above).

The operational sequence supervision unit 52 carries out a judgment process about whether or not to carry out a custom sequence (a custom program), in step S76, and a judgment process about the expiration of the prescribed time period in step S77. If it is judged that a custom sequence is not to be executed, then when the circuit board CB is conveyed into the apparatus, processing is executed repeatedly for mounting electronic components in the specified mounting number order, in accordance with the mounting coordinates, the mounting order data and the component data in FIG. 21, and then conveying the board out from the apparatus.

In the judgment process in step S76, it is judged whether or not a custom program name has been stated in the periodic execution sequence in FIG. 21. In step S77, it is judged whether or not a specified time period has elapsed since the execution of the first, or the previous, custom program, by using a timer built into the calculation processing unit 51 which is reset when execution of the program is started and which counts the elapsed time thereafter. If a custom program name is stated in the periodic execution sequence and the specified time period elapses, then the calculation processing unit 51 starts execution of the "special interpreter language processing execution routine" in step S78, in accordance with the judgment result from the operational sequence supervision unit 52 which judges "Yes", in other words, that a custom sequence is to be executed, in steps S76 and S77. If no custom program name is stated in the periodic execution sequence or the specified time period has not elapsed, then a "No" judgment is returned at either of step S76 or S77, and the "special interpreter language processing execution routine" is not executed. The "special interpreter language processing execution routine" based on the step S78 is the same as the process in step S68 in FIG. 16 which relates to the fourth embodiment described above.

Consequently, in this case, in parallel with the execution of a custom program based on the processing of the "special interpreter language processing execution routine" (in this case, the custom program "CleanNozzle"), the all component mounting completion judgment process in the following step S79, and depending on the circumstances, the board outward conveyance process in step S80 and the board inward conveyance process in step S71, are also executed. If the execution of the custom program "CleanNozzle" has not been completed even after the execution of the all component mounting completion judgment process or the board inward conveyance process has ended, then the calculation processing unit 51 continues the execution of the judgment process in step S72, in accordance with the judgment result from the operational sequence supervision unit 52 which judges "No" at step S72, in other words, that the special interpreter language processing execution routine has not been completed.

Figure 20:
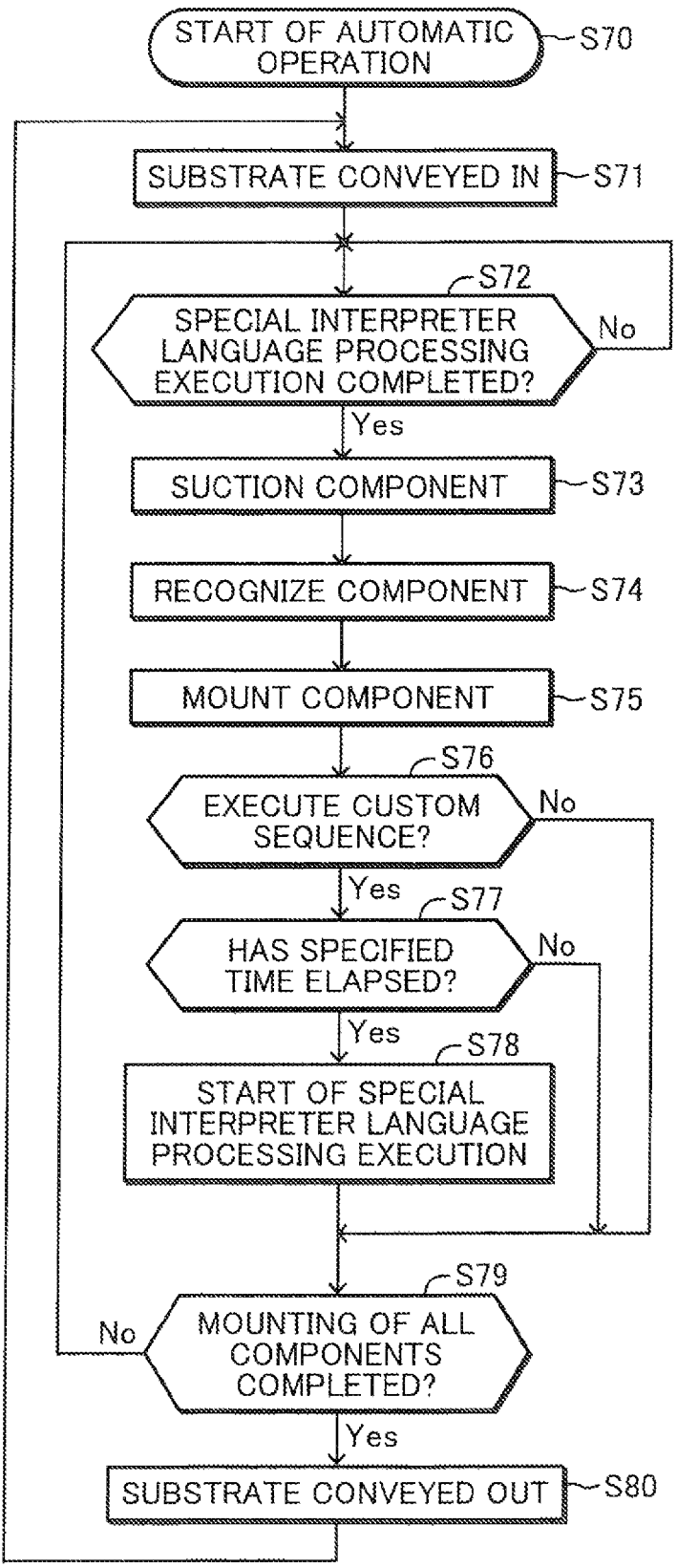
FIG. 20 is a flowchart showing an operational sequence which is executed by the component mounting apparatus relating to the fifth embodiment.

In the component mounting program in FIG. 20 relating to the fifth embodiment, if a custom program name is stated as a periodic execution sequence, then a sequence operation based on a custom program (in this case, the custom program "CleanNozzle") is executed at specified time intervals, during the execution of the component mounting program in FIG. 20.

Figure 22:
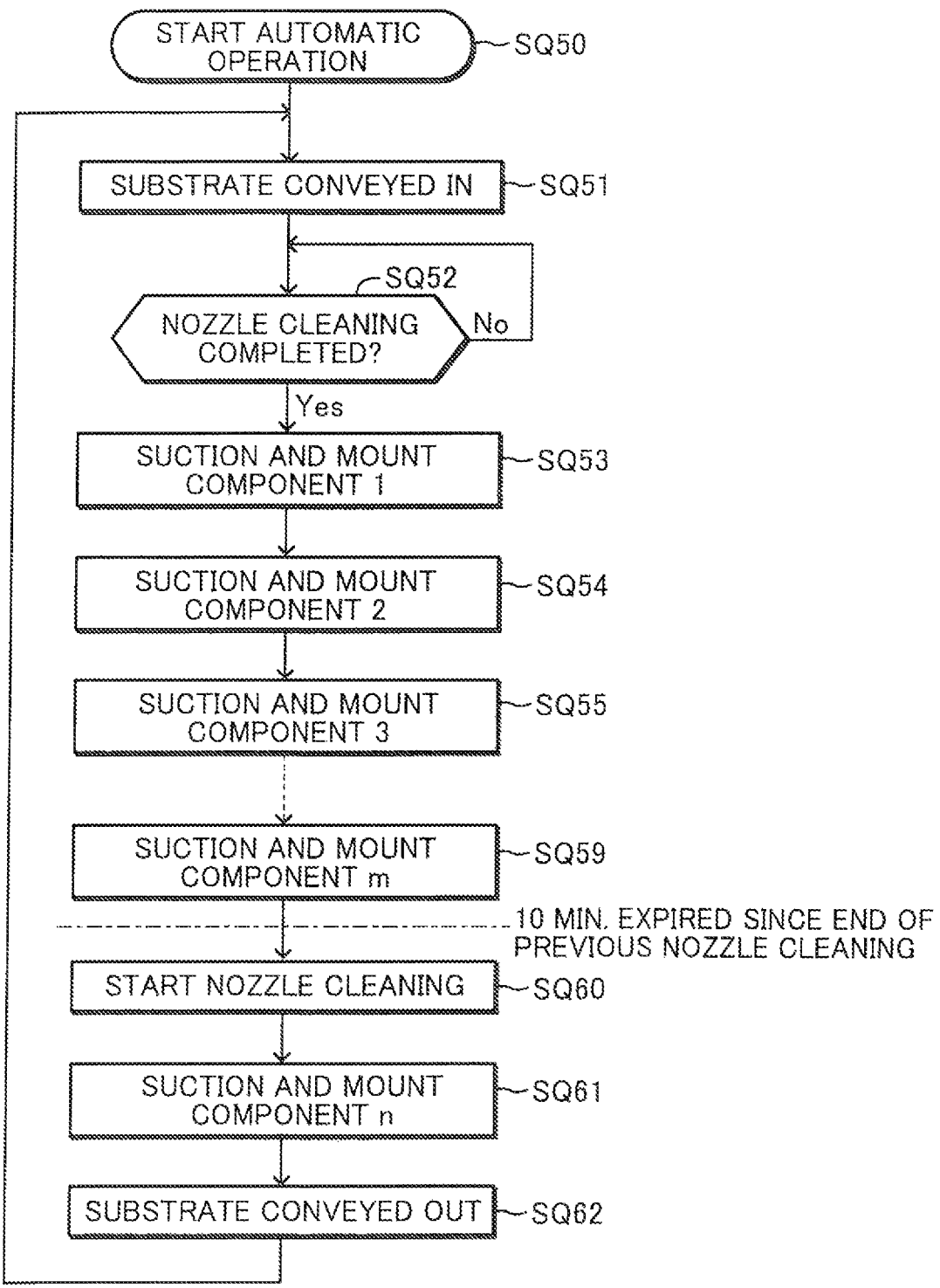
FIG. 22 is a sequence operation diagram of a component mounting apparatus relating to the fifth embodiment.
Figure 23:
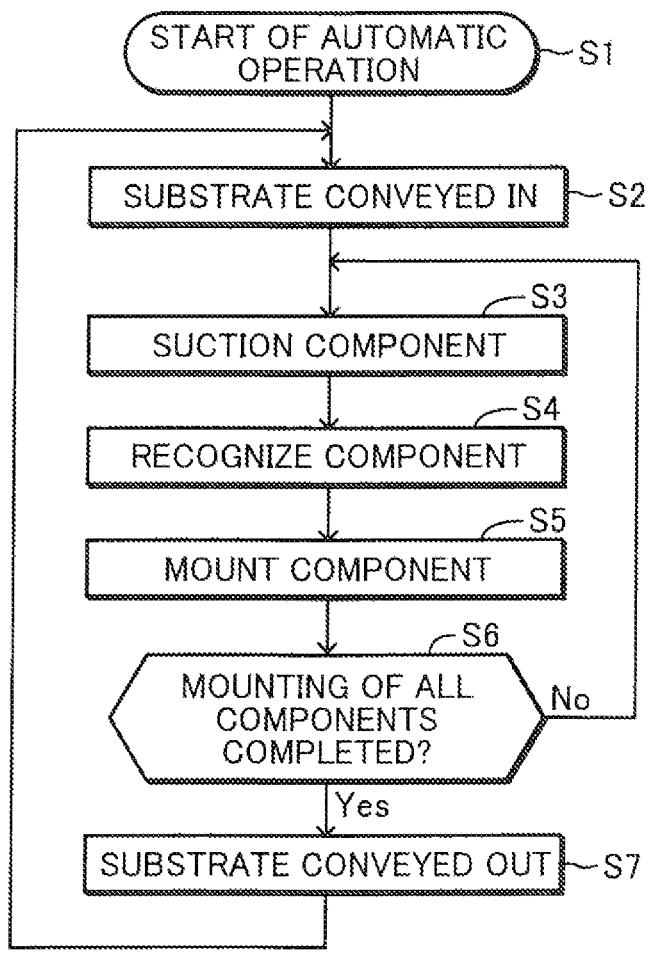
FIG. 23 is a flowchart showing an operational sequence which is executed by a conventional component mounting apparatus.

Therefore, as indicated by the sequence operation diagram in FIG. 22, after the start of automatic operation (SQ50), a sequence operation consisting of the following steps is executed repeatedly: inward conveyance of circuit board CB (SQ51), suction nozzle cleaning completion judgment processing (SQ52), standard suctioning and mounting of an electronic component 1 (SQ53), standard suctioning and mounting of electronic component 2 (SQ54), standard suctioning and mounting of electronic component 3 (SQ55), . . . , standard suctioning and mounting of electronic component m (m>3) (SQ59), start of suction nozzle cleaning at specified time interval (SQ60), standard suctioning and mounting of electronic component n (n>m) (SQ61) and outward conveyance of the circuit board CB (SQ62). In this case also, the aforementioned sequence operation is halted when the operator instructs an operational halt to the component mounting apparatus 1.

In the fifth embodiment which operates as described above, as well, by the processing in steps S73, S74 and S75 of the sequence which is specified by the operational sequence supervision process written in compiler language, standard sequence operations of suctioning, recognizing and mounting electronic components are carried out and electronic components are mounted on a circuit board CB. Therefore, standard sequence operations for mounting electronic components on a circuit board CB are carried out at high speed. Furthermore, the operational sequence supervision process also includes a process for starting the "special interpreter language processing execution routine" in step S78 in order to execute a custom program which specifies an operation that is different to a standard sequence operation, as well as including the judgment process in steps S76 and S77 for judging whether to execute the "special interpreter language processing execution routine", during the execution of the component mounting program, as designated by the sequence data in the setting parameters in FIG. 21 and the passage of time. The special custom program can be executed at specified time intervals during the execution of the component mounting program. Furthermore, since the custom program is written in interpreter language, then similarly to the case of the first embodiment described above, it is possible to respond accurately to many, varied surface mounting manufacturing processes.

Modification Example

Five embodiments of the present invention were described above, but the implementation of the present invention is not limited to the embodiment described above and various modifications are also possible within a range that does not deviate from the objects of the present invention.

In the first to fifth embodiments, when designating and executing a custom program which specifies a special sequence operation that is different from standard sequence operations consisting of suctioning, recognizing and mounting electronic components, a custom program name is stated as custom program designation information in the setting parameters. However, various methods are possible for designating the custom program. For example, it is possible to assign numbers to respective custom programs and to designate and execute a custom program by designating a number. Furthermore, it is also possible to designate and execute a custom program by designating a custom program start line and an address storing a custom program.

Furthermore, in the first embodiment described above, in a first method, a custom program which designates a special sequence operation is executed instead of a series of sequence operations consisting of suctioning, recognizing and mounting components. Furthermore, in the second embodiment described above, in a second method, a custom program which designates a special sequence operation is executed instead of any one operation of the suctioning, recognizing and mounting of components in the series of sequence operations. Furthermore, in the third embodiment described above, in a third method, a custom program which designates a special sequence operation is executed before or after any one operation of the suctioning, recognizing and mounting of components in the series of sequence operations. In the fourth embodiment described above, in a fourth method, a custom program specifying a special sequence operation is executed during inward conveyance or outward conveyance of a circuit board CB. In the fifth embodiment described above, in a fifth method, a custom program specifying a special sequence operation is executed at prescribed time intervals. However, these first to fifth methods can be used in combination with each other, and if a plurality of any of the first to fifth methods, or all of the first to fifth methods, are incorporated into the component mounting program, and if the execution of the custom program is controlled selectively in accordance with the setting parameters, then it is possible to respond more accurately to surface mounting manufacturing processes of many various types.

The concrete embodiments described above principally include an invention having the following composition.

The component mounting apparatus relating to one aspect of the present invention includes:

an operational sequence supervision unit (52) which is created in compiler language determining an operational sequence (FIGS. 3, 8, 12, 16 and 20) specifying a series of sequence operations of suctioning, recognizing and mounting a component;

a first memory unit (53) which stores component data relating to a component to be suctioned and mounted, and mounting data designating coordinates on a board where a component is to be mounted;

a second memory unit (54) which stores a custom program, written in interpreter language and specifying an operation different from the series of sequence operations, and custom program designation information that designates execution of the custom program; and a mounting unit (20) which mounts a component on a board that has been conveyed into the apparatus and then conveys the board out from the apparatus by using component data and mounting data stored in the first memory unit, by executing an operational sequence determined by the operational sequence supervision unit;

and the operational sequence supervision unit controls a switching process for switching from the series of sequence operations to an interpreter language processing execution routine for executing the custom program, during, or before or after, the series of sequence operations in accordance with the custom program designation information.

The mounting unit executes an operation specified by the custom program in accordance with the custom program designation information, during, or before or after, sequence operations of suctioning, recognizing and mounting a component as determined by the operational sequence supervision unit.

In this case, the switching process (S12) may be a process which executes an interpreter language processing execution routine (S17), instead of a series of sequence operations, during repeated execution of a series of sequence operations consisting of suctioning, recognizing and mounting a component. Furthermore, the switching process (S22, S25 and S28) may be a process for executing an interpreter language processing execution routine (S24, S27 and S30) instead of any one of suctioning, recognizing and mounting a component during the series of sequence operations, in the repeated execution of a series of sequence operations consisting of suctioning, recognizing and mounting a component. Furthermore, the switching process (S42, S45, S48 and S51) may be a process for executing an interpreter language processing execution routine (S43, S46, S49 and S52) before or after any one of suctioning, recognizing and mounting a component during the series of sequence operations, in the repeated execution of a series of sequence operations consisting of suctioning, recognizing and mounting a component. Furthermore, the switching process (S62 and S67) may be a process for executing an interpreter language processing execution routine (S68) during conveyance of a board into the apparatus or out from the apparatus. Moreover, the switching process (S72, S76 and S77) may be a process which executes an interpreter language processing execution routine (S78) at prescribed time intervals.

In the present invention which is composed as described above, the operational sequence supervision process includes an interpreter language processing execution routine, and a switching process for switching to execution of an interpreter language processing routine from a series of sequence operations, during, or before or after, a series of sequence operations, in accordance with custom program designation information which designates execution of a custom program. A sequence operation based on a custom program designated by program designation information is executed, during, or before or after, a sequence of suctioning, recognizing and mounting a component, in accordance with the determination of an operational sequence supervision process. By this means, the sequence operations of suctioning, recognizing and mounting a component are basically controlled by the operational sequence supervision process which is created in compiler language, and therefore high-specification sequence operations are processed at high speed. Furthermore, the custom program is written in interpreter language, and therefore the custom program can be created relatively easily. Since this custom program is executed appropriately during sequence operations based on a sequence program created in compiler language, then it is possible to respond accurately to many varied surface mounting manufacturing processes. In particular, a user is able to achieve a user-specific sequence operation relatively easily by a custom program, so as to respond accurately to many and varied surface mounting manufacturing processes.

This application is based on Japanese Patent application No. 2011-037991 filed in Japan Patent Office on Feb. 24, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A component mounting apparatus, comprising:
an operational sequence supervision unit which is created in compiler language, and determines an operational sequence specifying a series of standard sequence operations in which suctioning, recognizing and mounting a component are sequentially operated;
a first memory unit which stores component data relating to a component to be suctioned and mounted, and mounting data designating coordinates on a board where a component is to be mounted, the mounting data designating coordinates being given in advance as settling parameters;
a second memory unit which stores a custom program, written in interpreter language and specifying an operation different to the series of standard sequence operations, and custom program designation information that designates execution of the custom program; and a mounting unit which mounts a component on a board that has been conveyed into the apparatus and then conveys the board out from the apparatus by using component data and mounting data stored in the first memory unit, by executing an operational sequence determined by the operational sequence supervision unit, wherein the operational sequence supervision unit controls a sequence for causing the component mounting apparatus to repeatedly carry out the standard sequence operations and a switching process for switching from the series of standard sequence operations to an interpreter language processing execution routine for executing the custom program without carrying out the series of standard sequence operations, during, or before or after, the series of standard sequence operations in accordance with the custom program designation information; and the mounting unit executes an operation specified by the custom program in accordance with the custom program designation information, without simultaneously carrying out the series of standard sequence operations, during, or before or after, sequence operations of suctioning, recognizing and mounting a component as determined by the operational sequence supervision unit.

2. The component mounting apparatus according to claim 1, wherein the switching process is a process for executing the interpreter language processing execution routine in place of one series of sequence operations of repeatedly executed sequence operations, during the repeated execution of a series of sequence operations of suctioning, recognizing and mounting the component.

3. The component mounting apparatus according to claim 1, wherein the switching process is a process for executing the interpreter language processing execution routine in place of any of the suctioning, recognizing and mounting of a component during one series of sequence operations of repeatedly executed sequence operations, during the repeated execution of a series of sequence operations of suctioning, recognizing and mounting the component.

4. The component mounting apparatus according to claim 1, wherein the switching process is a process for executing the interpreter language processing execution routine before or after any of the suctioning, recognizing and mounting of a component during one series of sequence operations of repeatedly executed sequence operations, during the repeated execution of a series of sequence operations of suctioning, recognizing and mounting the component.

5. The component mounting apparatus according to claim 1, wherein the switching process is a process for executing the interpreter language processing execution routine during conveyance of the board into the apparatus or out from the apparatus.

6. The component mounting apparatus according to claim 1, wherein the switching process is a process for executing the interpreter language processing execution routine at prescribed time intervals.

* * * * *